(12) United States Patent
Zortea et al.

(10) Patent No.: US 8,428,203 B1
(45) Date of Patent: Apr. 23, 2013

(54) INTEGRATED TUNABLE RF NOTCH FILTER

(75) Inventors: Anthony Eugene Zortea, Pipersville, PA (US); Mathew McAdam, Vancouver (CA); Mathieu Gagnon, Verdun (CA); Graeme Boyd, North Vancouver (CA); Winston Ki-Cheong Mok, Vancouver (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 1142 days.

(21) Appl. No.: 12/349,328

(22) Filed: Jan. 6, 2009

(51) Int. Cl.
*H03D 1/04* (2006.01)
*H03D 1/06* (2006.01)
*H03K 5/01* (2006.01)
*H03K 6/04* (2006.01)
*H04B 1/10* (2006.01)
*H04L 1/00* (2006.01)
*H04L 25/08* (2006.01)

(52) U.S. Cl.
USPC .................... 375/346; 375/285; 375/316

(58) Field of Classification Search .................... 375/346
See application file for complete search history.

(56) References Cited

U.S. PATENT DOCUMENTS

| | | | | |
|---|---|---|---|---|
| 2002/0158689 | A1* | 10/2002 | Harris et al. | 330/129 |
| 2003/0227984 | A1* | 12/2003 | Batra et al. | 375/340 |
| 2005/0010958 | A1* | 1/2005 | Rakib et al. | 725/111 |
| 2005/0116773 | A1* | 6/2005 | Laletin | 330/69 |
| 2005/0186930 | A1* | 8/2005 | Rofougaran et al. | 455/260 |
| 2007/0297537 | A1* | 12/2007 | Luce | 375/322 |

OTHER PUBLICATIONS

Safarian, et al.; Integrated Blocker Filtering RF Front Ends; Publication of 2007 IEEE Radio Frequency Integrated Circuits Symposium; pp. 13-16.

Chi, et al.; A Superheterodyne Receiver Front-End with On-Chip Automatially Q-Tuned Notch Filters; Publication of 2007 IEEE Radio Frequency Integrated Circuits Symposium; pp. 21-24.

Tenbroek, et al.; Single-Chip Tri-Band WCDMA/HSDPA Transceiver without External SAW Filters and with Integrated TX Power Control; Publication of 2008 IEEE International Solid-State Circuits Conference; pp. 202-203, 607, Feb. 3-7, 2008.

Mirzaei, et al.; A Low-Power WCDMA Transmitter with an Integrated Notch Filter; IEEE Journal of Solid-State Circuits; vol. 43; No. 12; Dec. 2008; pp. 2868-2881.

Zortea, et al; Integrated Tunable RF Notch Filter; Specification and drawings of related U.S. Appl. No. 12/055,948, filed Mar. 26, 2008.

* cited by examiner

*Primary Examiner* — Erin File
(74) *Attorney, Agent, or Firm* — Knobbe Martens Olson & Bear LLP

(57) ABSTRACT

Large interfering signals (interferers) with spectra near a desired signal can cause distortion in a wireless receiver due to a non-linear signal path. It is typically a performance advantage to attenuate these interferers earlier in the signal path, rather than later in the signal path, because these interferers can cause saturation of amplifying stages. In certain situations, the frequency offset of an interfering signal, with respect to the desired signal, can be on the order of 10 megahertz (MHz), whereas the center frequencies can be on the order of several gigahertz (GHz). Thus, a filter with "baseband" precision would be needed at radio frequency to notch out the interferer, which is relatively difficult to do. Disclosed is a technique to estimate the relative strength and center frequency of the interferer and to place the center frequency of a notch filter adaptively and precisely at the interferer location.

35 Claims, 20 Drawing Sheets

INTEGRATED TUNABLE RF NOTCH FILTER

CROSS-REFERENCE TO RELATED APPLICATION

This application is related to commonly-owned application titled RUN-LENGTH BASED SPECTRAL ANALYSIS, Ser. No. 12/055,948, filed on Mar. 26, 2008, now U.S. Pat. No. 8,019,028, issued on Sep. 13, 2011, the entirety of which is hereby incorporated by reference.

BACKGROUND

1. Field of the Invention

The invention generally relates to electronics. In particular, the invention relates to filtering of interference.

2. Description of the Related Art

Co-existence of wireless communication links from different wireless standards, and a generally crowded wireless spectrum results in "interfering" radio signals near the frequency of a desired radio signal to be received, as illustrated in FIG. 1.

In an extreme case, the presence of a relatively large interferer near the desired signal makes reception of the desired signal impossible. Even in a relatively good case, the ability to handle a relatively large interferer increases the linearity and baseband filtering requirements of the radio, which in turn increases the radio's cost and power.

One conventional solution to the problem of a large interferer is to increase the linearity and increase the analog baseband requirements of the radio front end. This approach increases both the cost and the power used by the radio.

In another approach illustrated in FIG. 2, the interfering signal is separated at baseband, then up-converted to RF and subtracted from the total RF signal. See Aminghasem Safarian, et al., *Integrated Blocker Filtering RF Front Ends*, Radio Frequency Integrated Circuits (RFIC) Symposium, Jun. 3-5, 2007, 2007 Institute of Electrical and Electronics Engineers (IEEE), pp. 13-16. Also see A. Mirzaei and H. Darabi, *A Low-Power WCDMA Transmitter With an Integrated Notch Filter*, IEEE Journal of Solid-State Circuits, Institute of Electrical and Electronics Engineers (IEEE), Vol. 43, No. 12, December 2008.

Receivers for wireless radio typically tolerate interfering signals (interferers) in two basic duplex scenarios: Time Division Duplex (TDD) and Frequency Division Duplex (FDD).

FIG. 9 illustrates an example of a spectrum of channels that can be observed in Time Division Duplex (TDD) systems. In a TDD system, a receiver and a transmitter of a transceiver operate at different times. However, co-located wireless transceivers that operate near the same band as a desired signal, such as in the case of Wi-Fi and WiMAX transmission, can result in relatively large nearby interferers.

In the illustrated example of FIG. 9, a WiMAX transceiver may be receiving a signal centered at 2,501 megahertz (MHz), while a nearby Wi-Fi transceiver may be transmitting a signal around 2,472 MHz.

In a Frequency Division Duplex (FDD) system, a transceiver's own transmitter can be transmitting at the same time that it is receiving a signal. Due to the finite amount of attenuation of the local transmitter signal into the receive signal by the duplexer and other filtering, there may exist a residual transmit signal received with the received signal sufficient to cause distortion.

SUMMARY OF THE DISCLOSURE

Large interfering signals (interferers) with spectra near a desired signal can cause distortion in a wireless receiver due to a non-linear signal path. It is typically a performance advantageous to attenuate these interferers earlier in the signal path, rather than later in the signal path, because these interferers can cause saturation of amplifying stages. In certain situations, the frequency offset of an interfering signal, with respect to the desired signal, can be on the order of 10 megahertz (MHz), whereas the center frequencies can be on the order of several gigahertz (GHz). Thus, a filter with "baseband" precision would be needed at radio frequency to notch out the interferer, which is relatively difficult to do. Disclosed is a technique to estimate the relative strength and center frequency of the interferer and to place the center frequency of a notch filter adaptively and precisely at the interferer location.

Embodiments of the invention preferably use an analog circuit with a relatively narrow notch characteristic to filter out the interferer at RF; estimate the strength and center frequencies of interferers; and control the center frequency and depth of the notch filter.

One embodiment is a calibration technique for locating a contour that is useful for control of a notch filter having a two-dimensionally control characteristic, such as a control for capacitance and a control for resistance. In the calibration technique, while holding a first control, such as a control for capacitance, constant, the second control, such as a control for resistance is varied in relatively widely spaced apart observations. A rough indication of a location of the notch is determined by these widely spaced apart observations. More closely spaced apart observations around the rough indication locate the location of the notch with greater precision. The procedure is repeated to collect data points indicating the location of the deepest notch in two dimensions. Then, a technique such as least-squares is used to fit the data to a contour, which should be used for filtering out interference.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Although particular embodiments are described herein, other embodiments, including embodiments that do not provide all of the benefits and features set forth herein, will be apparent to those of ordinary skill in the art.

Figure 1:
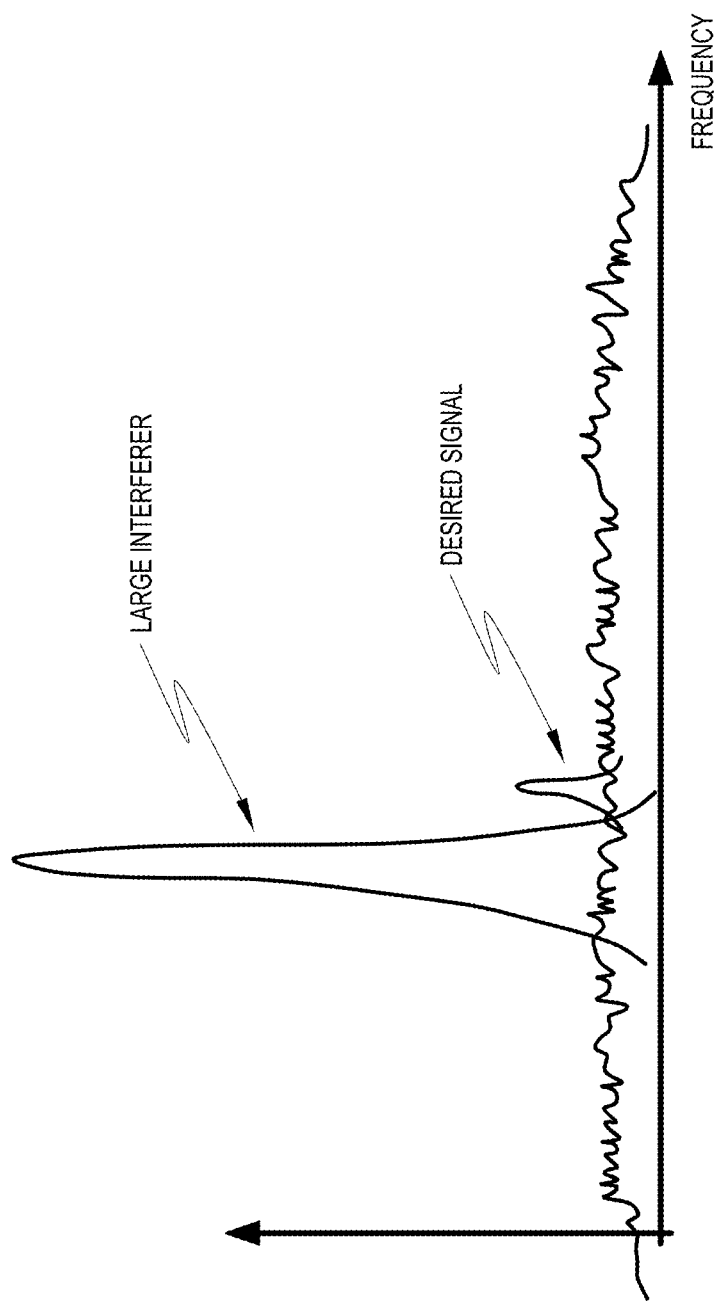
FIG. 1 illustrates an example of a spectrum of a received signal.
Figure 2:
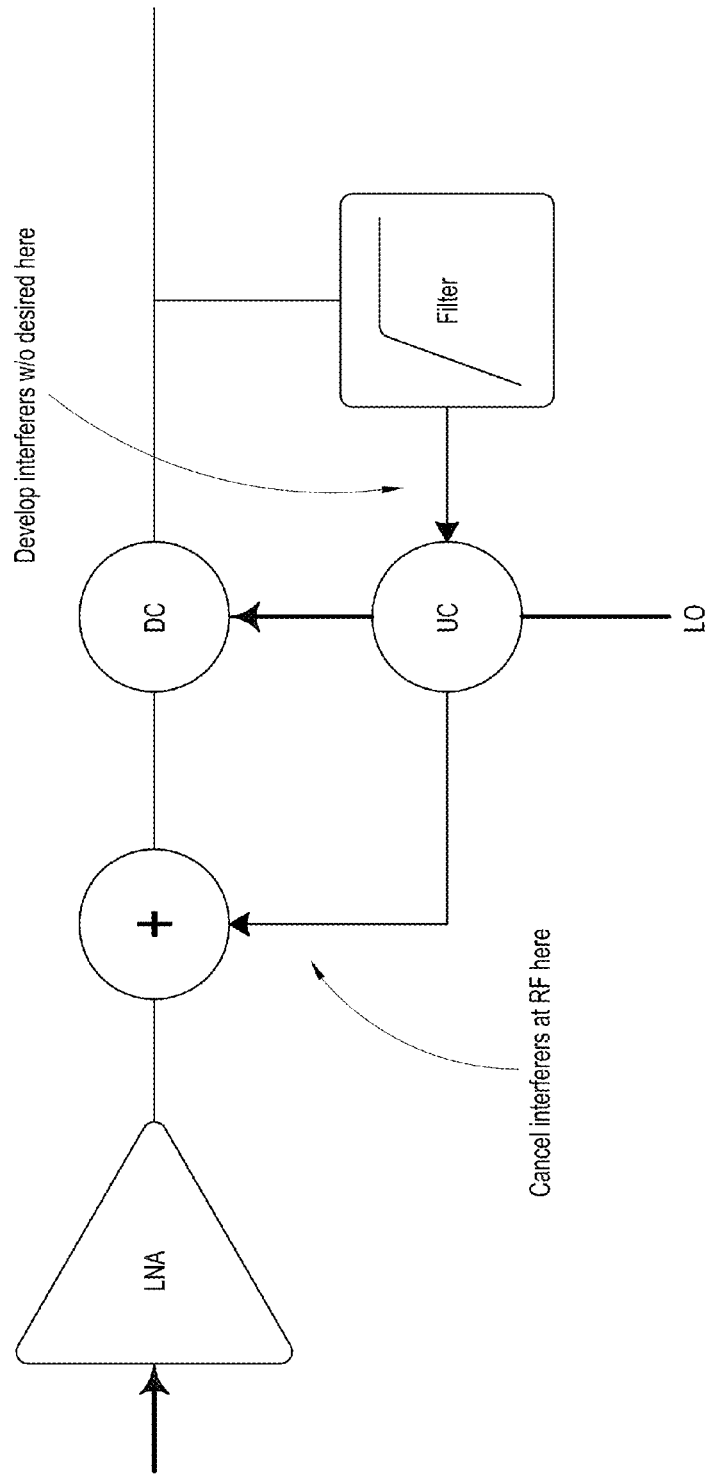
FIG. 2 illustrates an example of a prior art system.

To adequately receive the desired signal in the presence of a large interferer as shown in FIG. 1, a designer is typically faced with one of two choices: (1) increase the linearity and baseband filtering requirements of the radio; or (2) notch out the interferer earlier in the chain, at radio frequency, and relax the linearity and baseband filtering requirements of the radio. Choice 1 is a typical conventional approach.

Choice 2 uses a relatively high precision center frequency and a relatively high Q notch filter. For example, the desired and interfering signals may be separated by as little as a few MHz. An example of a ratio of carrier frequency to center frequency or filter transition band is expressed in Equation 1.

$$\frac{F_{separation}}{F_{carrier}} = \frac{5 \text{ MHz}}{3.5 \text{ GHz}} \approx 0.1\% \qquad \text{Equation 1}$$

Equation 1 illustrates that the ratio of filter frequencies to carrier frequency is relatively small. The high-Q nature of the filter may be managed using a resonating tank circuit, but the center frequency precision will typically be controlled with an active control loop. An applicable high-Q filter will be readily determined by one of ordinary skill in the art.

Figure 3:
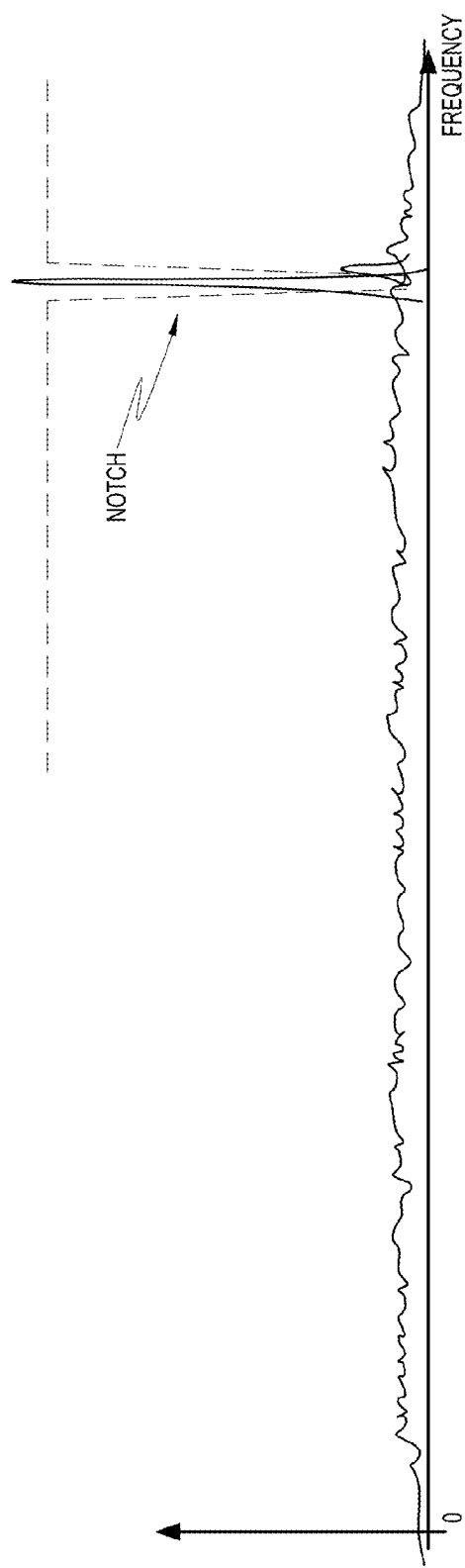
FIG. 3 illustrates signals and a notch.

FIG. 3 illustrates signals and a notch, with the chart extending to DC (0 frequency). The interferer location and strength can be assessed by an interference scanner, which will described in further detail later. In one embodiment, the effectiveness of notch filtering is assessed by the interference scanner.

Typically, the active control loop of the high-Q filter will use an estimate of the center frequency of the interferer. Techniques to estimate the center frequency will now be described.

Figure 4:
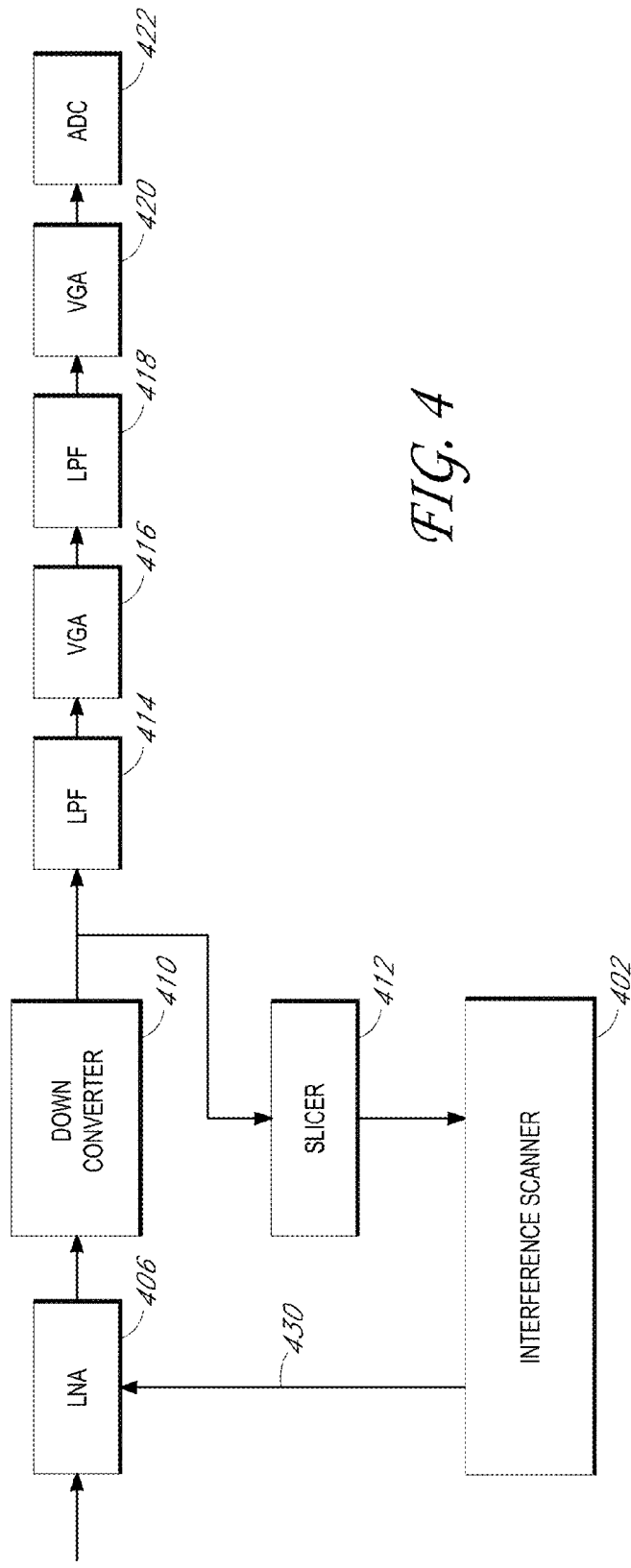
FIG. 4 illustrates a top-level architecture a front-end of a receiver using an interference scanner in an adaptive interference cancellation block.

FIG. 4 illustrates a top-level architecture a front-end of a receiver using an interference scanner 402. Note that interferers at RF appear as high frequency signals at baseband, as shown in FIG. 5.

RF signals, including the desired signal and one or more interferers, are received by a low-noise amplifier (LNA) 406. The RF signals from the LNA 406 are converted to baseband by a downconverter 410.

An output of the downconverter 410 is provided to a slicer 412 and to other components 414, 416, 418, 420, 422 of the receiver front-end. In the illustrated embodiment, the slicer 412 samples the output of the downconverter 410 and determines whether the output is positive or negative. For example, the slicer 412 can generate hard symbols of zero or one from the output of the downconverter 410. The output of the slicer 412 is provided to the interference scanner 402. The interference scanner 402 will be described later in greater detail. The other components 414, 416, 418, 420, 422 can be arranged in a variety of ways, including, but not limited to, conventional ways. In one embodiment, one or more notch filters are incorporated into the LNA 406. Line 430 illustrates control of the one of more notch filters of the LNA 406 by the interference scanner 402.

Figure 5:
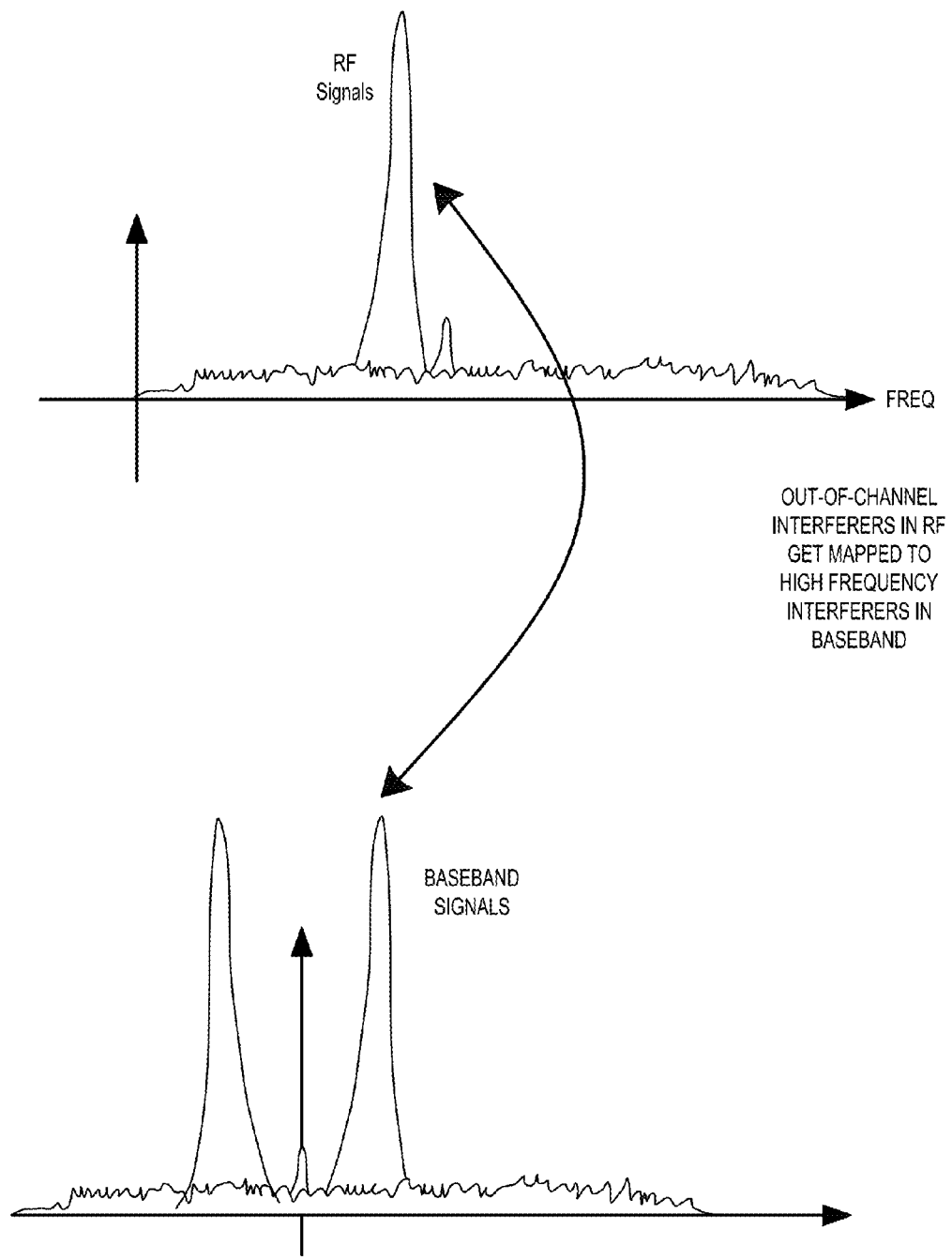
FIG. 5 illustrates an interferer originally in RF and mapped to baseband.

With reference to FIG. 5, interferers appear as high-frequency baseband signals. The probability of a zero-crossing per unit time from the output of the slicer 412 (FIG. 4) increases as the strength and frequency of the interferer increases. The output of the slicer 412 (FIG. 4) can be used to determine the zero-crossing of the down-converted signal; therefore shorter runs of ones or zeroes should be expected as the frequency of the interferer increases. For example, counters can be used to count the length of runs of ones or zeroes from the output of the slicer 412 (FIG. 4).

Figure 6:
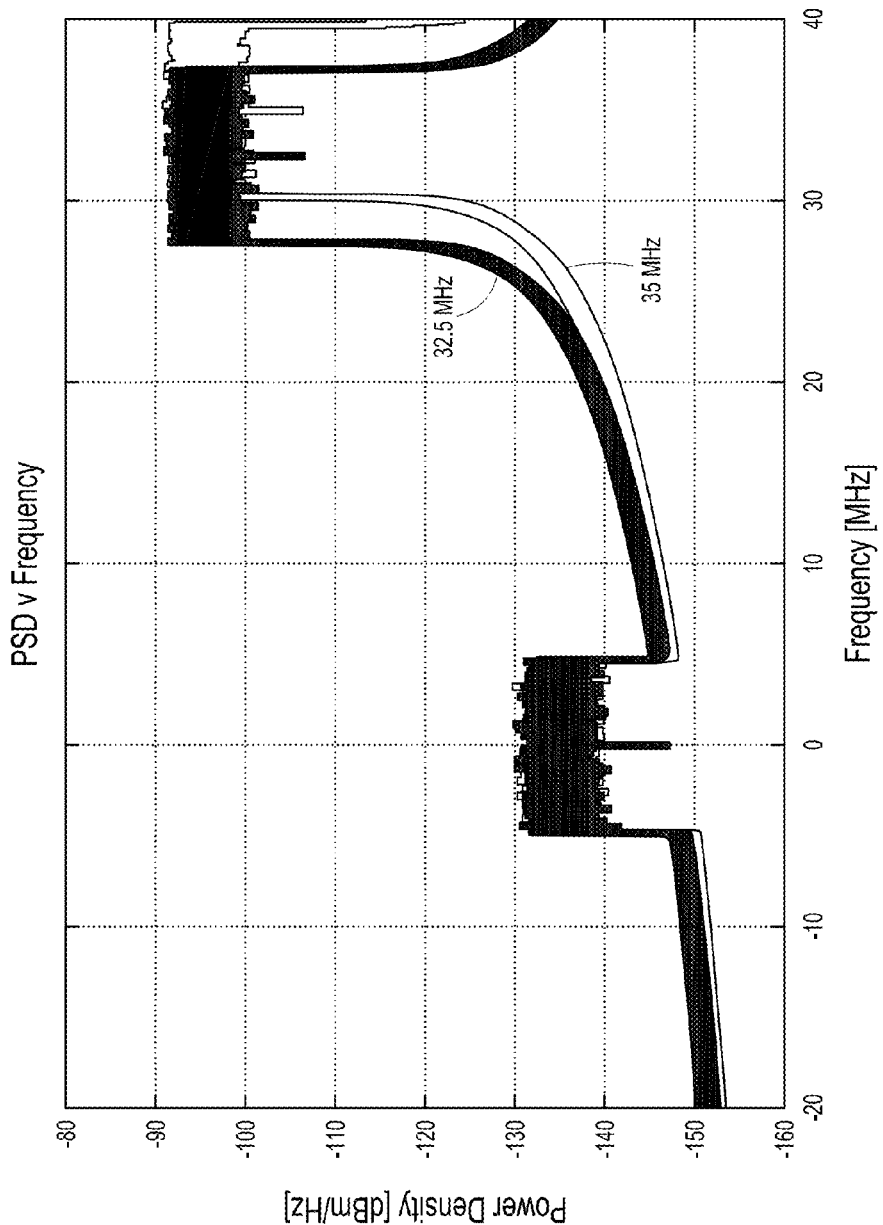
FIG. 6 is an overlay of two spectra with interferers in slightly different locations (32.5 MHz and 35 MHz frequency offsets).

Consider two cases: one in which an interferer is 3.25*BWdes away from the desired signal, and another in which an interferer is 3.5*BWdes away, wherein BWdes is the bandwidth of the desired signal. For this example, the bandwidth BWdes=10 MHz, so the interferers are at 32.5 MHz and 35 MHz frequency offsets. The spectra of the two cases are shown in FIG. 6.

Figure 7:
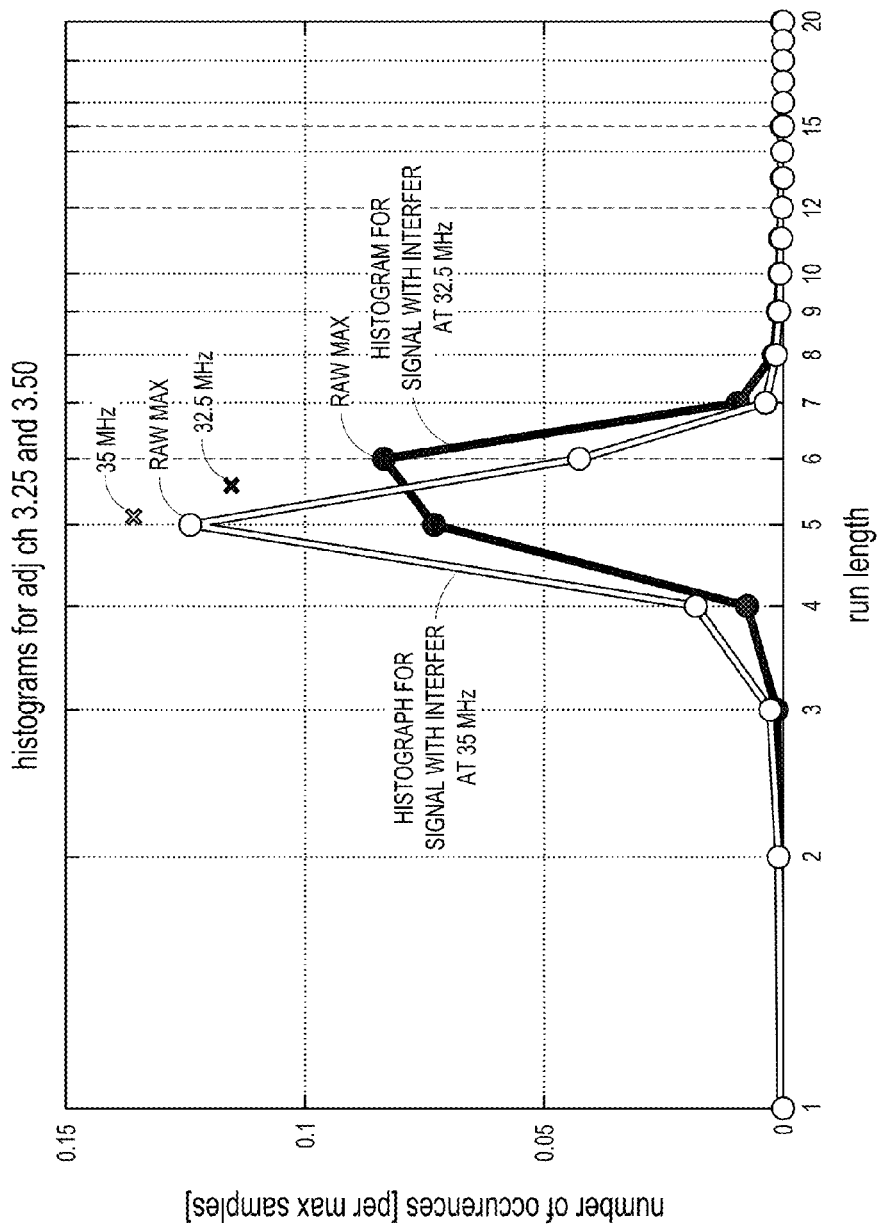
FIG. 7 is an overlay of two histograms of run-lengths of slicer output for two different interferer signals.

A histogram of run-lengths from the output of the slicer 412 (FIG. 4) for these two cases (32.5 and 35) are overlaid and shown in FIG. 7. The histogram represents frequency of occurrence distribution of run-lengths encountered. Note that the peak occurrence run-length falls at run-length 5 for the interferer at 35 MHz frequency offset, and at run length 6 for the interferer at 32.5 MHz frequency offset. To clarify, peak occurrence run-length means the run-length value with the highest frequency of occurrence in the frequency distribution and not the maximum length of the runs of zeroes and/or ones encountered.

This data represented in the histogram raises 2 questions: (1) what is the relationship of run-length to interferer center frequency; and (2) run-lengths are discrete counts (natural number counts), but the interferer center frequency can be any frequency.

In one embodiment, equation 2 is used to convert a run-length to a signal frequency.

$$F_{runlength} = \frac{F_{samp}/2}{RL} \qquad \text{Equation 2}$$

Figure 8:
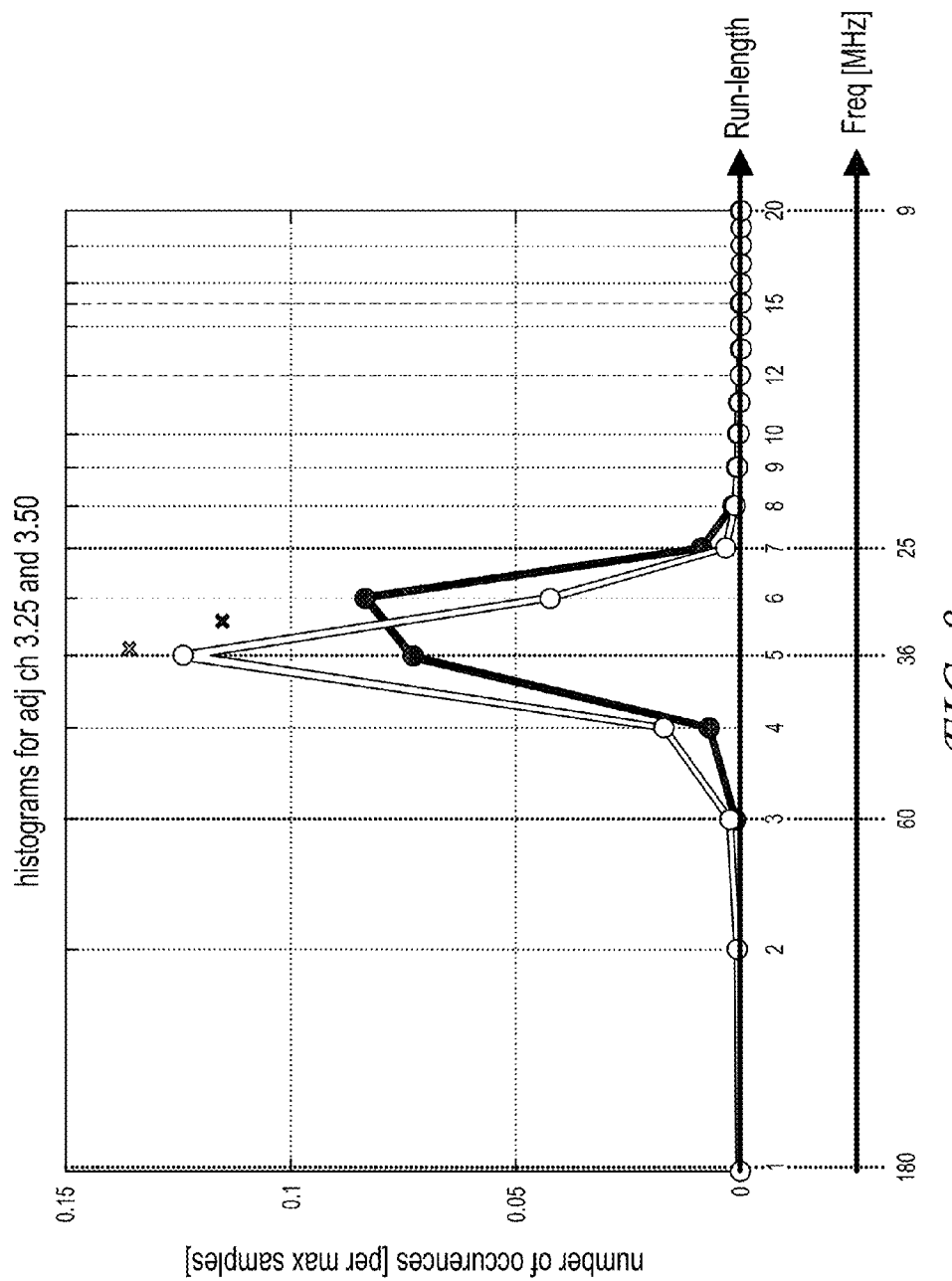
FIG. 8 illustrates a relationship of run-length to frequency
Figure 9:
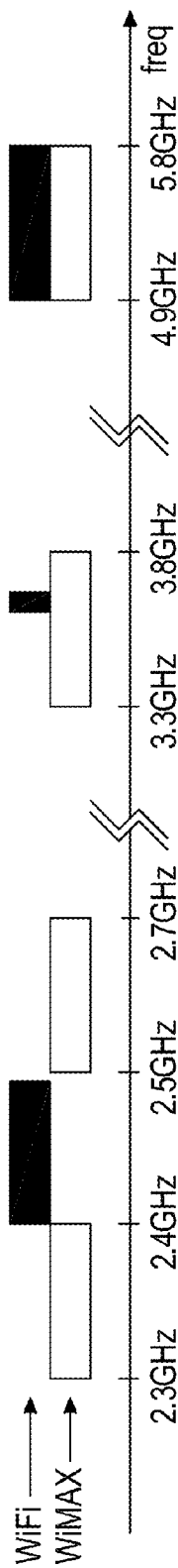
FIG. 9 illustrates an example of Wi-Fi and WiMAX frequency bands.

In Equation 2, $F_{runlength}$ is the frequency of the interferer, $F_{samp}$ is the sampling frequency of the slicer 412 (FIG. 4), and RL is the count of the run length (count of consecutive ones or consecutive zeroes). Using Equation 2, the run-length axis can be associated with frequency, as shown in FIG. 8. The run-length (x-axis value) with the peak frequency of occurrence can be used to estimate a frequency of the interfering signal. Alternatively or in addition to the foregoing, an estimate of a signal strength of the interfering signal relative to a signal strength of the desired signal can be determined by examination of the value of the peak frequency of occurrence (y-axis). The estimated interfering signal strength can be used to determine whether to activate an interference filter, to assess the effectiveness of a particular interference filter configuration, to determine whether to adjust or tune an interference filter, or the like.

The run-lengths RL are of course discrete counts. For example, there cannot be a peak run length of 5.3 counts. The peak run length will be a discrete count, such as 5 or 6 counts in the illustrated example. However, data other than just the peak run length can also be used to evaluate a frequency of the interferer or a magnitude of the interferer. This other data is represented by the shape of the histogram. For example, points that are near the maximum frequency of occurrence run length can be used to estimate where the peak occurrence for run-length would have fallen if there had been a continuous run-length axis or a finer resolution count (faster sampling rate), that is, a non-natural number peak run-length. Techniques can also estimate where on the y-axis the maximum run-length would have fallen.

In the illustrate embodiment, the following Matlab® function can be used to estimate the continuous coordinates of the run-length with the maximum number of occurrences.

```
function [xmax,ymax] = findPeak(rls,fsamp);
%-- estimates the continuous co-ordinates of the maximum run-length
%-- and converts the maximum run-length to frequency
%-- inputs:
%-- rls == histogram of run-lengths
%-- fsamp == slicer sampling frequency
%-- outputs:
%-- xmax == maximum run-length, converted to frequency of
          maximum interferer
%-- ymax == number of occurrences of maximum run-length
%-- get max rl and neighbors
mp = find(rls==max(rls));
if (mp==1 | mp==length(rls));
    xmax = fsamp/2/mp;
    ymax = max(rls);
else
    vec = rls(mp-1:1:mp+1);
    xn = mp-1; yn=vec(1);
    xp = mp; yp=vec(2);
    xb = mp+1; yb=vec(3);
    if (vec(1)<=vec(3))
        xpeak =
        (xn*yb - xp*yb + xb*yn + xp*yn - xb*yp - xn*yp)/(2*yn - 2*yp);
        ymax = (xpeak-xn)*(yp-yn)/(xp-xn) + yn;
    else
        xpeak =
        (xn*yb + xp*yb + xb*yn - xp*yn - xb*yp - xn*yp)/(2*yb - 2*yp);
        ymax = (xpeak-xb)*(yb-yp)/(xb-xp) + yb;
    end;
    xmax = fsamp/2/xpeak;
end;
```

The above algorithm performs a linear extrapolation around the "raw" or discrete max to estimate an extrapolated max value. While the term extrapolation is used, the estimated data is within the run-length of the data (x-axis), but is outside the domain of the counted frequency of occurrence data (y-axis). The illustrated Matlab® function assumes that the peak is shaped like a simple "triangle" near the raw maximum (discrete count maximum). Visually, the algorithm can be observed in the graph of FIG. 7 by extrapolating the lines near the maximum of the two curves. The extrapolated data is represented by two "x" marks on the graph. The extrapolated peak is calculated to lie on a line that is formed by the raw maximum point and the nearest neighbor point that is farthest away from it, such as the adjacent point that has the lower count.

For example, the points with run lengths 6 (maximum) and 7 (adjacent with lower count) are used for the curve that is extrapolated to a 32.5 MHz peak. For example, the points with run lengths 4 (maximum) and 5 (adjacent with lower count) are used for the curve that is extrapolated to a 35 MHz peak. The extrapolated peak is determined to be located at the intersection of said line and another line formed by negating the slope (changing the sign of the slope) of said line and passing said line through the nearest neighbor point that is closest to the maximum, such as the other adjacent point (point at run length 5 for the 32.5 MHz peak and the point at run length 6 for the 35 MHz peak). The foregoing illustrates that the extrapolated x-axis value (non-natural number run length) can be used to estimate a frequency of the interfering signal.

In addition, alternatively or in addition to the foregoing, an estimate of a signal strength of the interfering signal relative to a signal strength of the desired signal can be determined by examination of the magnitude of the extrapolated peak (y-axis). The estimated interfering signal strength can be used to determine whether to activate an interference filter, to assess the effectiveness of a particular interference filter configuration, to determine whether to adjust or tune an interference filter, or the like.

The foregoing algorithm can be implemented via hardware, firmware, software, or by a combination of the foregoing. For example, a microprocessor, microcontroller, or other processor can be used to assess the interferer frequency. Using such techniques, such as the foregoing algorithm, the coordinates of the peak of the interferer, which for the example of FIG. 7, is shown below in FIG. 8. The frequency for the interferer as mapped in baseband versus run length count is expressed along a second horizontal axis of FIG. 8. A frequency associated with a local oscillator for the downconverter can be used to remap the baseband frequency of the interferer back to radio frequency. In many systems, the frequency of the local oscillator can change depending on the channel that is desired to be received. The interferer frequency at radio frequency can be the local oscillator frequency plus or minus the interferer frequency assessed at baseband.

The analysis of the run-lengths of the sign (positive or negative) of a signal can be used as a crude estimate of the spectrum of arbitrary signals, after the run-lengths are converted to frequencies, according to Equation 2. This analysis, illustrated with the aid of the histogram, should be limited to spectra with relatively few dominant peaks.

One application of the invention is in the field of wireless radio receivers; however, the interference scanner can be used for spectrum estimation for arbitrary signals.

Figure 10:
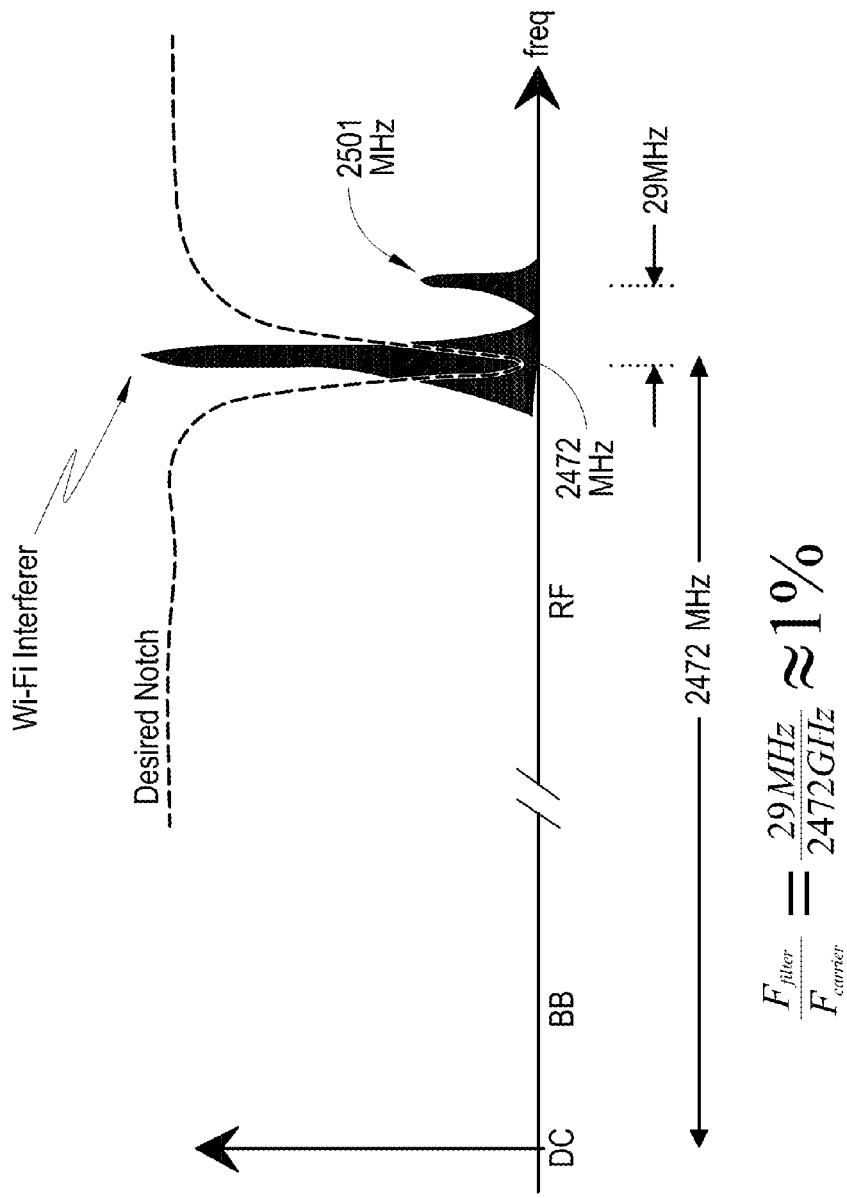
FIG. 10 illustrates an example of tight "baseband" precision at radio frequency.

FIG. 10 illustrates an example of a situation in which the frequency offset of an interfering signal is relatively small with respect to a center frequency of a desired signal. Interferers with narrow frequency offsets can be difficult to filter out. An efficient notch filter circuit for interfering signals should have baseband precision (on the order of 1 MHz) at radio frequencies (on the order of 1 GHz), as shown in the example of FIG. 10. While generally illustrated in the context of "direct conversion" receivers, which convert directly to baseband, the principles and advantages disclosed herein are also applicable to receivers utilizing intermediate frequency (IF) stages.

In the illustrated example of FIG. 10, the "fractional bandwidth" is around 0.01, or 1%. It can be difficult and expensive to integrate circuits with that order of frequency precision.

Figure 11:
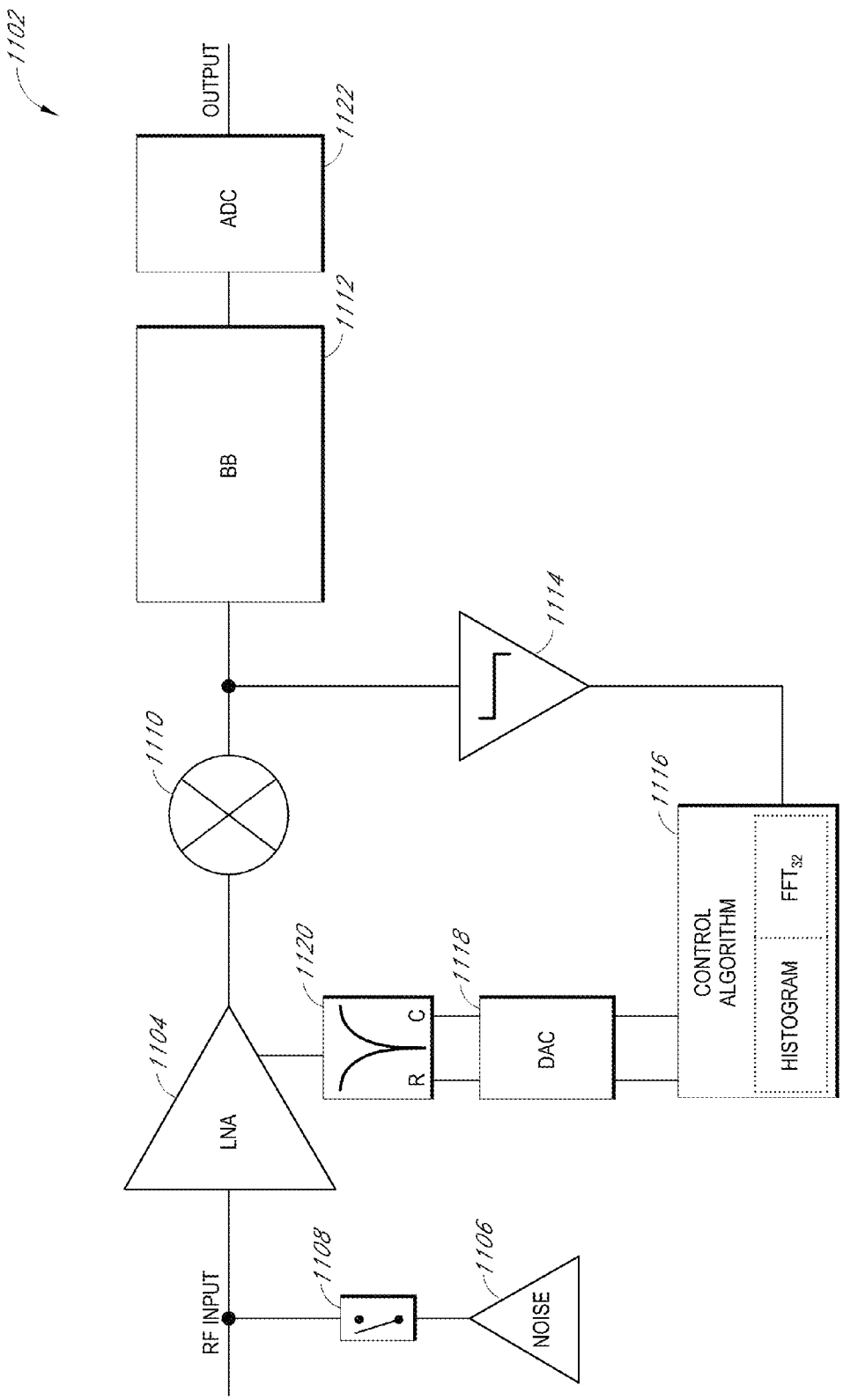
FIG. 11 illustrates an example of a front-end of a receiver of an embodiment of the invention.

FIG. 11 illustrates an example of a front-end 1102 of a receiver. Further details of the circuit of FIG. 11 can be found As FIG. 19.41 on page 739 of *The Design of CMOS Radio-Frequency Integrated Circuits,* 2nd ed., by Thomas H. Lee, Cambridge University Press. An RF input is provided as an input to a low noise amplifier (LNA) 1104. A broadband noise source 1106 is provided for tuning of a notch filter circuit. A switch 1108 permits the noise from the broadband noise source 1106 to be switched in and out of the RF input signal path.

An output of the LNA 1104 is provided as an input to a downconverter 1110, which provides a downconverted signal as an input to baseband processing circuits 1112 and to an input of a notch filter control circuit. The illustrated notch filter control circuit includes slicer 1114, a processor 1116, a digital-to-analog converter 1118, and a notch filter circuit 1120. A circuit that can embody the LNA 1104 and the notch filter circuit 1120 will be described later in connection with FIG. 4. An output of the baseband processing circuits 1112 can be provided to an analog-to-digital converter 1122 for decoding of data and the like. In the illustrated embodiment, the slicer 1114 is configured to sample the output of the downconverter 1110 and determine whether the output is positive or negative. For example, the slicer 1114 can generate hard symbols of zero or one from the output of the downconverter 1110. The processor 1116 can correspond to a microprocessor or other controller configured to execute computer-readable instructions retrieved from memory, such as firmware, can correspond to dedicated hardware, or any combination of firmware (software) and hardware. The processor 1116 can also be implemented using a licensable core, a signal processor, control logic, or the like, and can be integrated with the digital-to-analog converter 1118. In one embodiment, the various components depicted in FIG. 11 are integrated in a single die.

Figure 12:
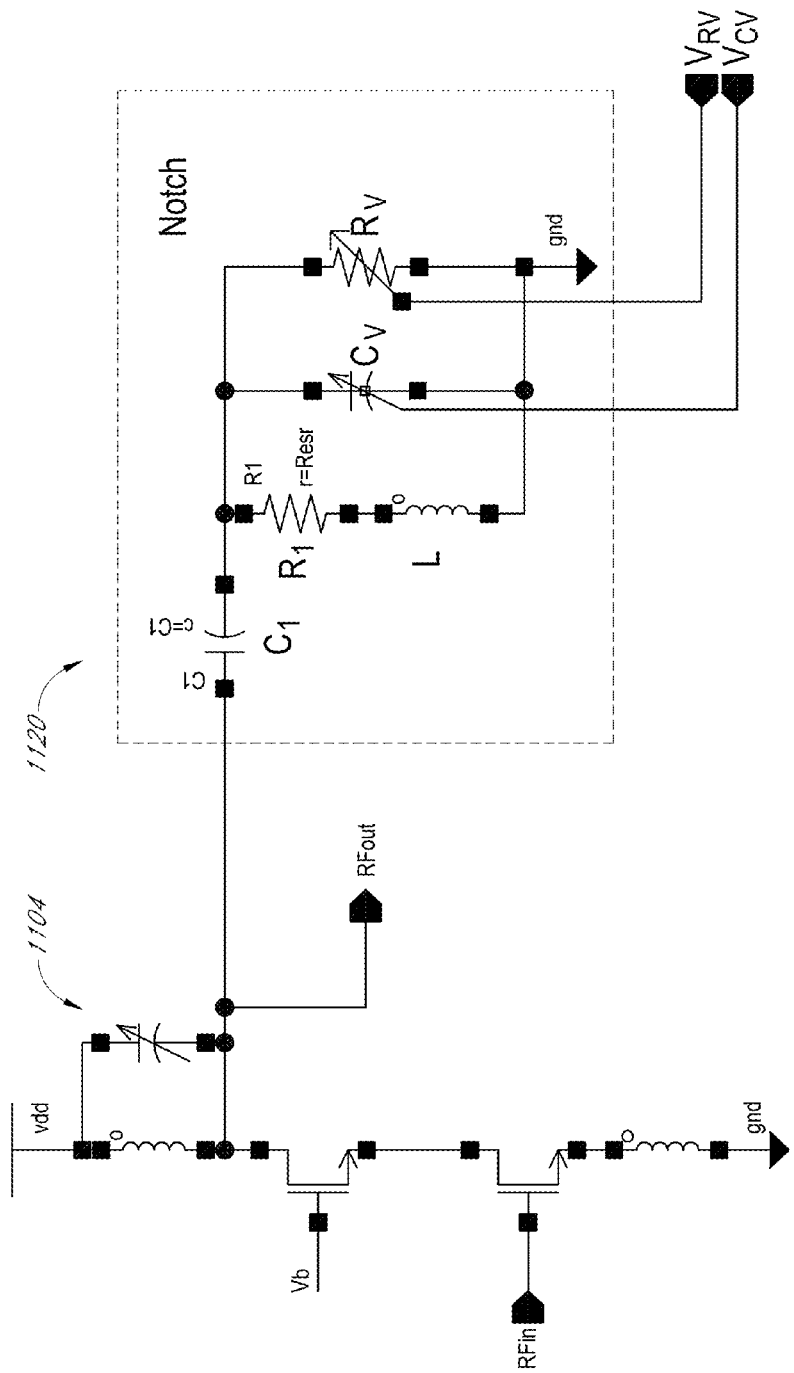
FIG. 12 is a schematic diagram of a behavioral low noise amplifier (LNA) and a notch filter circuit that can be used with an embodiment of the invention.

FIG. 12 is a schematic diagram of a behavioral low noise amplifier (LNA) and a notch filter circuit that can be used with an embodiment of the invention. The left portion of the schematic diagram corresponds to the LNA 1104 (FIG. 11), and the right portion of the schematic diagram corresponds to the notch filter circuit 1120 (FIG. 11). Other circuits can be used for the LNA 1104 or the notch filter circuit 1120. In addition, while only one notch filter circuit 1120 is illustrated, more than one notch filter circuit 1120 can be used to accommodate the filtering of multiple interferers. As will be explained in greater detail later in connection with FIGS. 13-15, the notch filter characteristics of the illustrated notch filter circuit 1120 vary with a variable negative resistance $R_V$ and a variable shunt capacitance $C_V$. In one embodiment, the variable negative resistance $R_V$ is implemented by a cross-coupled differential transistor pair. For further reference, please refer to FIG. 19.44 of *The Design of CMOS Radio-Frequency Integrated Circuits by Thomas Lee,* id. Other devices to implement a negative resistance will be readily determined by one of ordinary skill in the art.

In the illustrated example, the capacitance and the negative resistance can be adjusted with DC voltage, $V_{RV}$ and $V_{CV}$, respectively, which can be provided by outputs of the digital-to-analog converter 1118. One difficulty with the illustrated circuit is that both the center frequency (see FIG. 13) and the steepness (depth) (see FIG. 14) of the notch filtering characteristic are two-dimensionally controlled by the values for the variable negative resistance $R_V$ and the variable shunt capacitance $C_V$.

Figure 13:
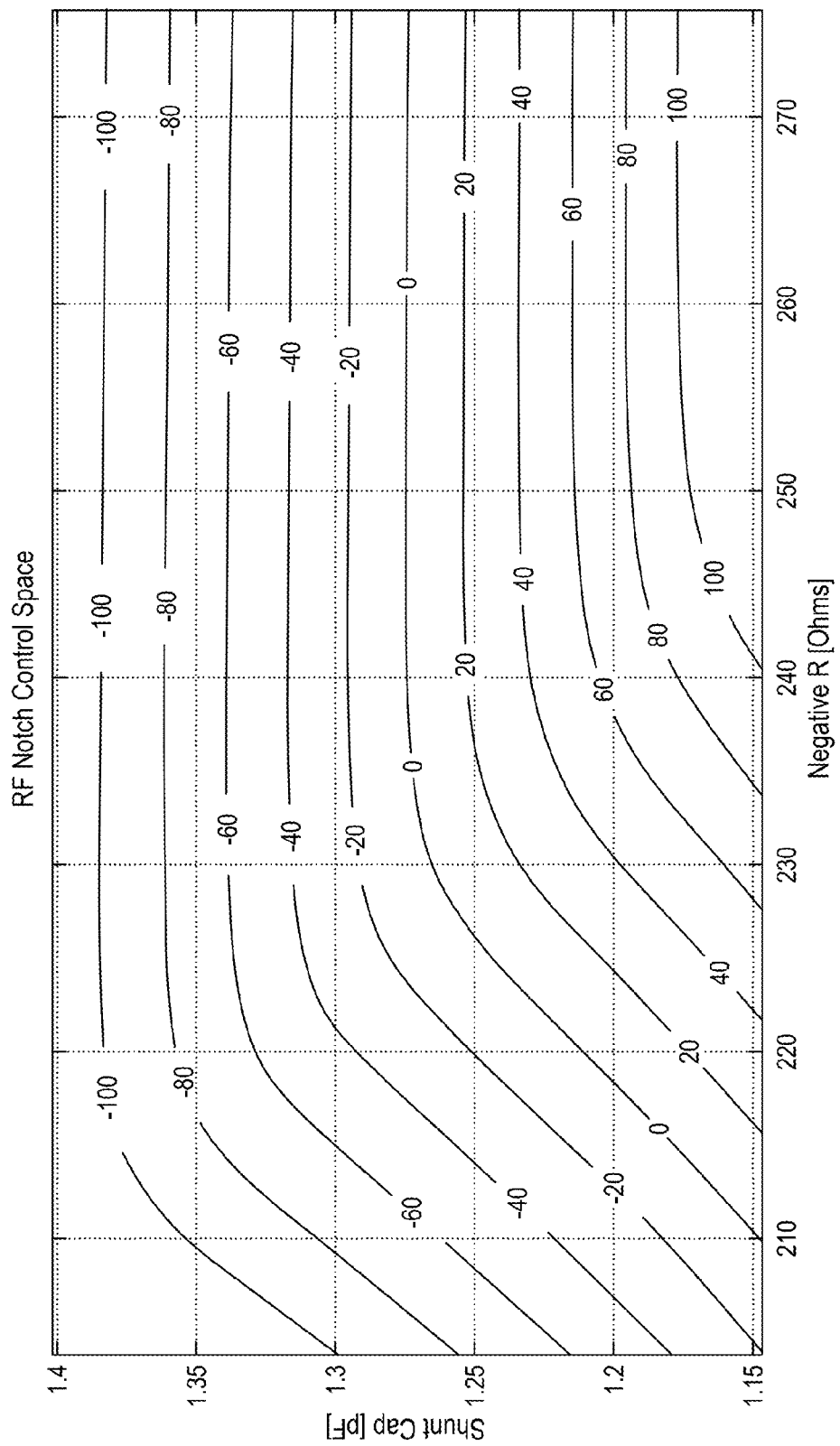
FIG. 13 is a two-dimensional chart that illustrates the variance of the center frequency of the notch filter circuit with respect to varying values for the variable negative resistance $R_V$ and a variable shunt capacitance $C_V$.

FIG. 13 is a two-dimensional chart that illustrates the variance of the center frequency of the notch filter circuit 1120 (FIG. 12) with respect to varying values for the variable negative resistance $R_V$ and the variable shunt capacitance $C_V$. In FIG. 13, a value for an inductance L is 2.9 nanohenries (nH) and a value for a capacitance C1 is 140 femtofarads (fF).

Values for the negative variable resistance $R_V$ are expressed along a horizontal axis. Values for the variable shunt capacitance $C_V$ are expressed along a vertical axis. Each curve in FIG. 13 represents a frequency offset, in megahertz (MHz), of center frequency of the notch filter circuit 1120. The frequency offset is an offset from the desired signal center frequency.

Figure 14:
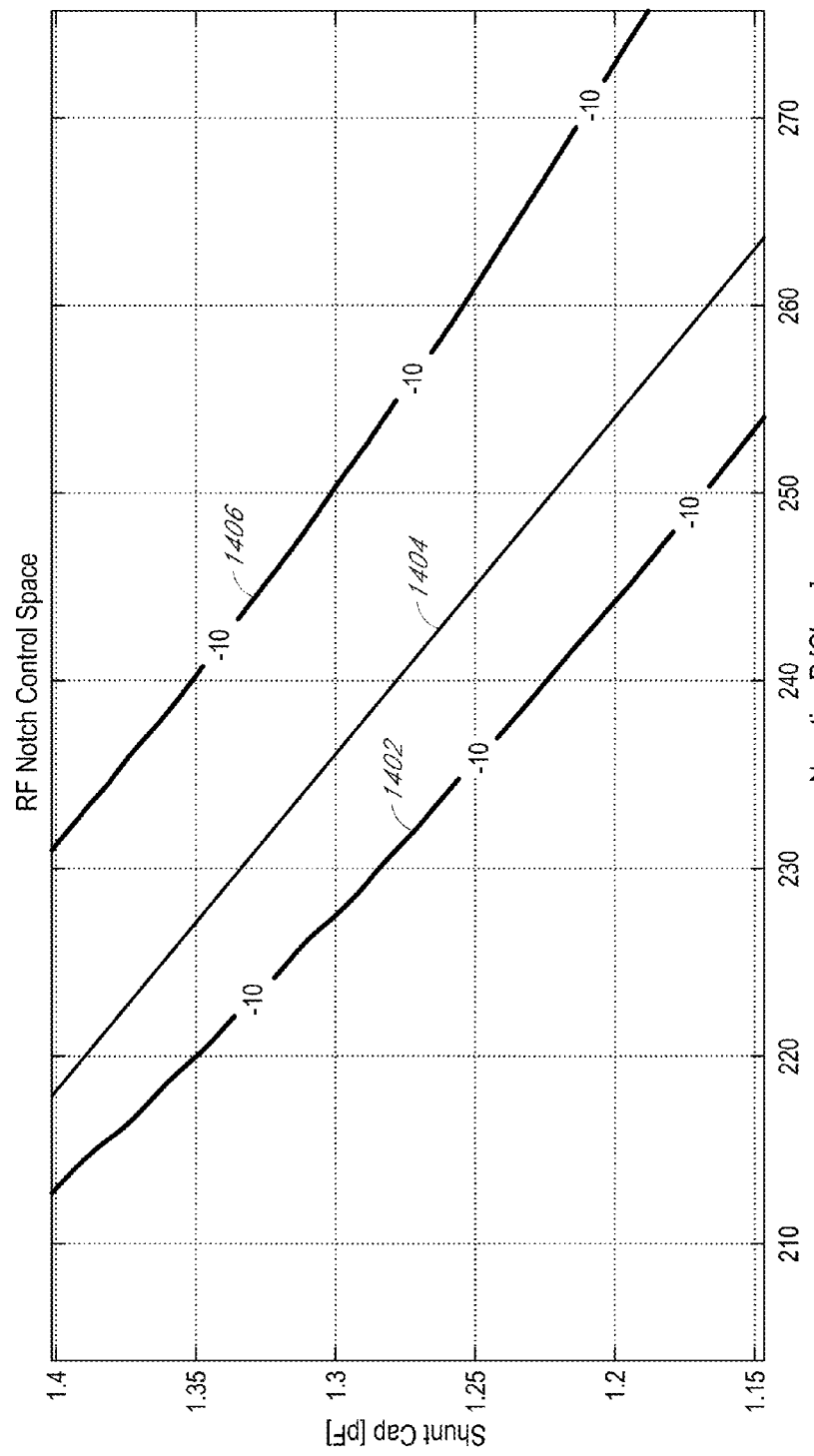
FIG. 14 is a two-dimensional chart that illustrates the notch depth of the notch filter circuit with respect to varying values for the variable negative resistance $R_V$ and the variable shunt capacitance $C_V$.

FIG. 14 is a two-dimensional chart that illustrates the notch depth of the notch filter circuit 1120 (FIG. 12) with respect to varying values for the variable negative resistance $R_V$ and a variable shunt capacitance $C_V$. The horizontal axis and the vertical axis are the same as in FIG. 13. For illustration, three contours 1402, 1404, 1406 are shown. A leftmost contour 1402 and a rightmost contour 1406 establish boundaries between which, the notch filter is at least 10 dB deep, that is, has at least 10 dB of attenuation. Outside the leftmost contour 1402 and the rightmost contour 1406, the attenuation is less than 10 dB. A center contour 1404 illustrates a contour for maximum attenuation.

Figure 15:
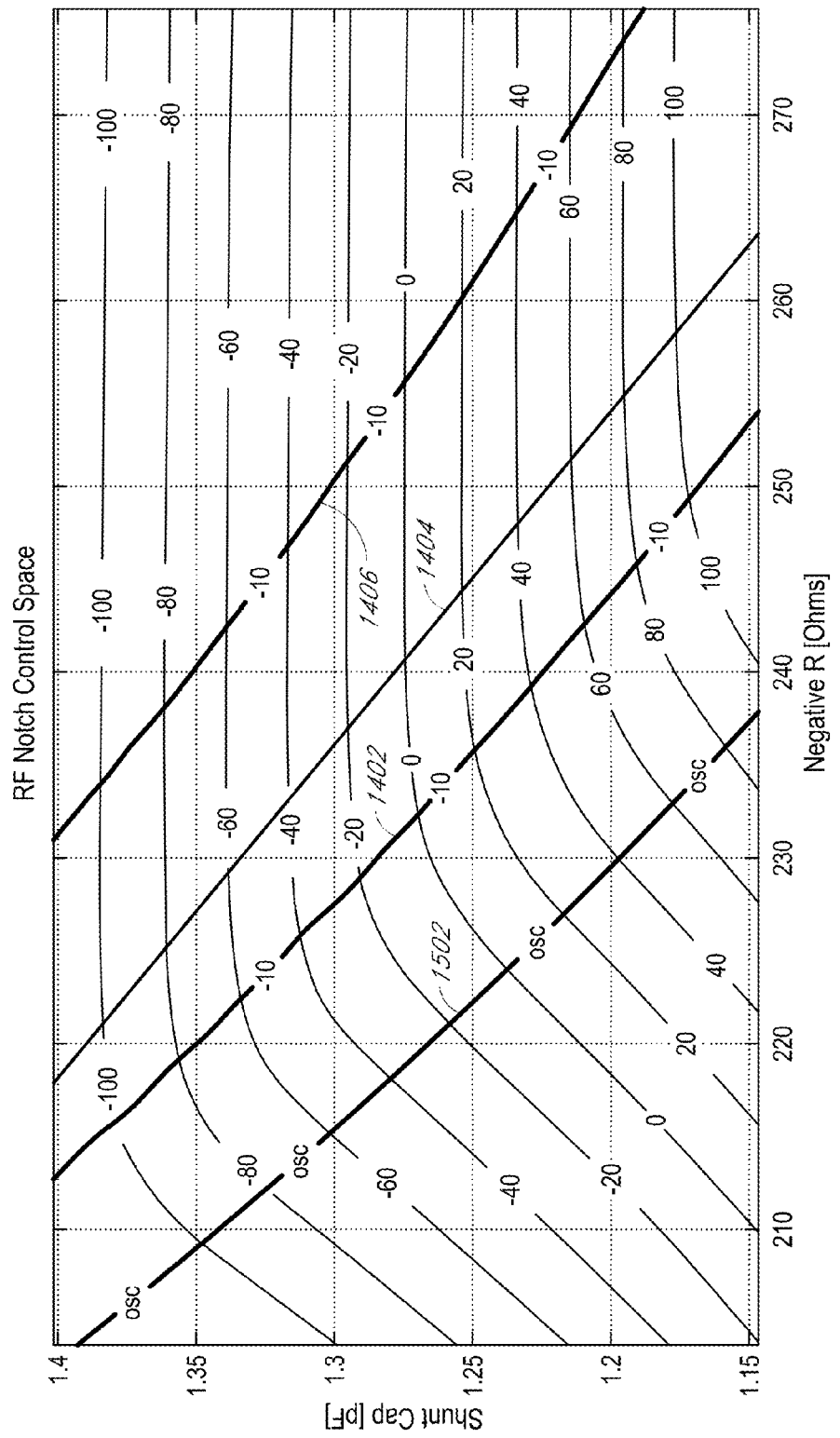
FIG. 15 is a two-dimensional chart with the curves and contours from FIGS. 13 and 14 overlaid.

FIG. 15 is a two-dimensional chart with the curves and contours from FIGS. 13 and 14 overlaid. The horizontal axis and the vertical axis are the same as in FIGS. 13 and 14. A fourth contour 1502 indicates a contour of stability. Operation to the left of the fourth contour 1502 is unstable and should be avoided. Operation to the right of the fourth contour 1502 is stable. Based on the curves and contours in FIG. 15, if a notch center frequency having a −40 MHz offset is desired with maximum notch depth, the values for variable negative resistance $R_V$ and for the capacitance $C_V$ can be determined by the intersection of the center contour 1404 with the curve for −40 MHz. In the illustrated example, this occurs at about a negative resistance of 233 ohms and a capacitance of about 1.32 picofarads (pF).

As evidenced by the foregoing, the notch filter circuit uses a two-dimensional control: the variable negative resistor $R_V$ and the variable shunt capacitance $C_V$. To place the notch filtering at a particular frequency, and to give it a relatively good, such as maximum depth, both the variable negative resistance $R_V$ and the variable shunt capacitance $C_V$ should be properly set.

One embodiment of the invention periodically updates an "R-C contour" which effectively stores parameters for an equation that generates $R_V$ and $C_V$ adjustment settings for a given desired notch center frequency. As long as the parameters for the equation are fresh, a notch can be placed virtually instantly at the location of the interferer.

$R_V$ and $C_V$ can be modeled as a polynomial in "$f_{desired}$" or "f", the desired notch frequency, as shown in Equations 3 and 4.

$$Rv(f_{desired}) = a_{Rv1}f + a_{Rv2}f^2 + \ldots \qquad \text{Equation 3}$$

$$Cv(f_{desired}) = a_{Cv1}f + a_{Cv2}f^2 + \ldots \qquad \text{Equation 4}$$

An overview of a technique that can be used to find settings for the variable negative resistor $R_V$ and the variable shunt capacitance $C_V$ is set forth below. With reference to FIG. 11, a broadband noise source is activated at the input of the LNA 1104. In the illustrated embodiment, the broadband noise source 1106 is activated and/or the switch 1108 is switched to couple the broadband noise source 1106 to the input of the LNA 1104. In the illustrated example, the broadband noise analysis path includes the broadband noise source 1106, the switch 1108, the LNA 1104, the downconverter 1110, the slicer 1114, the processor 1116, the digital-to-analog converter 1118, to the notch filter circuit 1120. In an alternative embodiment, the LNA 1104 is placed into a high noise mode by, for example, reducing biasing current to the LNA 1104, instead of the use of a separate broadband noise source, such as the broadband noise source 1106. In one embodiment, the slicer 1114 and the processor 1116 can estimate the output spectrum of the LNA 1104/notch filter circuit 1120.

Figure 16:
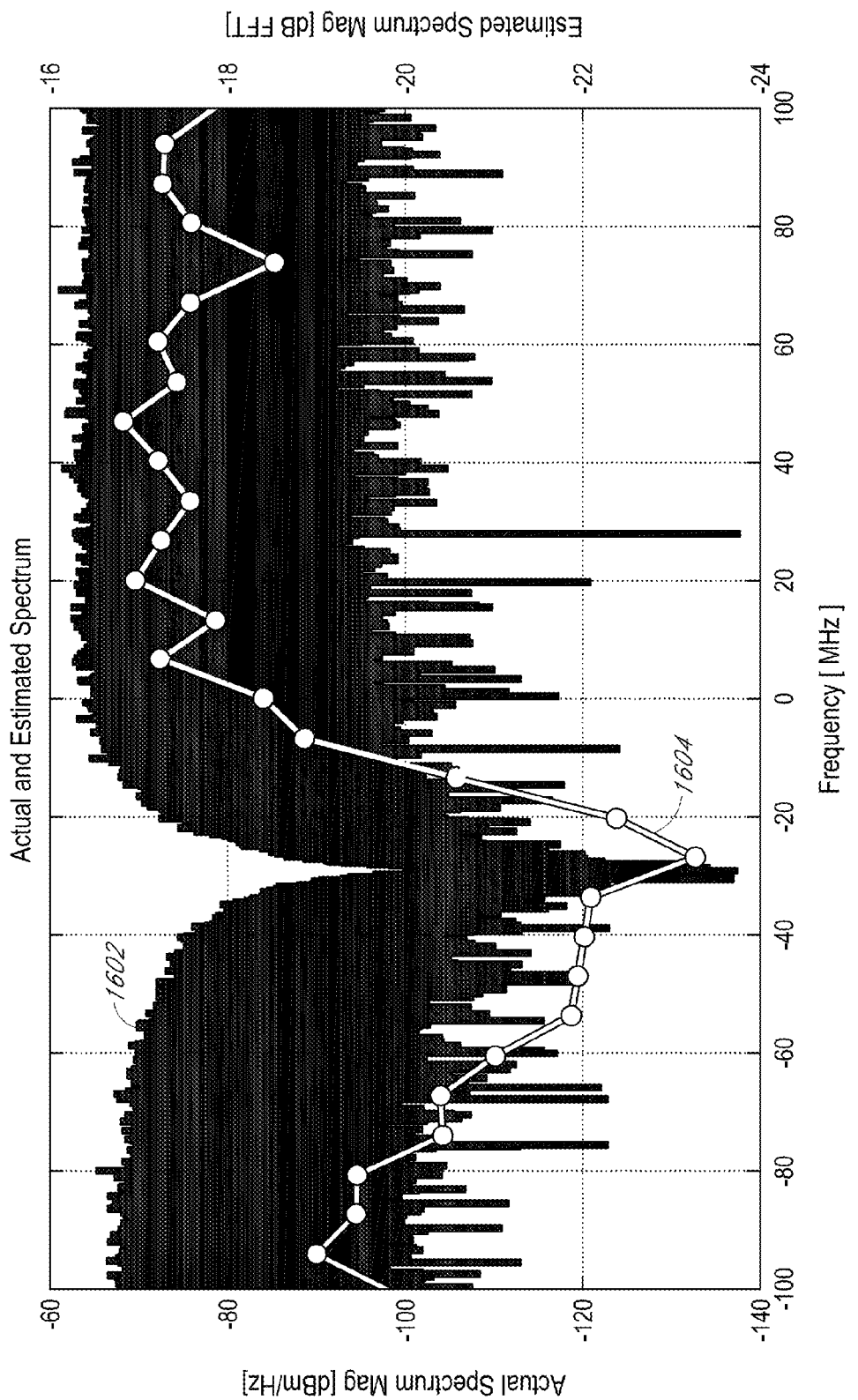
FIG. 16 illustrates a measured actual spectrum of the broadband noise that has been filtered by the notch filter circuit, and an estimated spectrum for the same signal based on a baseband output of the downconverter.

FIG. 16 illustrates a measured actual spectrum 1602 of the broadband noise that has been filtered by the notch filter circuit 1120 (RF output of the LNA 1104/notch filter circuit 1120), and an estimated spectrum 1604 for the same signal based on a baseband output of the downconverter 1110. For example, the estimated spectrum 1604 can be determined by techniques disclosed in U.S. patent application Ser. No. 12/055,948, filed on Mar. 26, 2008, and in connection with FIGS. 1-8 herein, which are generally related to the counting of run lengths of a sign and arranging the counts in a histogram-like manner.

In one embodiment, rather than counting run lengths, the estimated spectrum 1604 is obtained by averaging, in the frequency domain, N M-point FFTs (fast Fourier transforms) of a sign (zero or one) of the down-converted signal, wherein in the illustrated example, M=32, and N=128. Other values for M and N are applicable. As illustrated by FIG. 16, the estimated spectrum 1604 is capable of discerning a notch in the spectrum. In one embodiment, the use of the estimated spectrum 1604 is preferred over the actual spectrum 1602 because the amount of hardware used to generate the estimated spectrum 1604 is much less than the FFT hardware typically used to obtain the actual spectrum 1602.

With particular settings for the variable negative resistor $R_V$ and the variable shunt capacitance $C_V$, the center frequency of the notch and the depth of the notch should vary. The notch filter circuit 1120 notches out a corresponding portion of the frequency spectrum, and the frequency spectrum is analyzed by the slicer 1114 and the processor 1116.

In one embodiment, a broadband noise source is enabled, a setting is selected for the variable negative resistor $R_V$ and for the variable shunt capacitance $C_V$, and the characteristics of the notch are analyzed. Various other settings for the variable negative resistor $R_V$ and for the variable shunt capacitance $C_V$ are selected and analyzed to provide data points for establishing the curves and contours described earlier in connection with FIGS. 13-15. In one embodiment, a least squares technique is used to determine the coefficients for the functions $Rv(f_{desired})$ and $Cv(f_{desired})$ expressed in Equations 3 and 4. Other techniques for fitting the coefficients to the data are also applicable.

Figure 17:
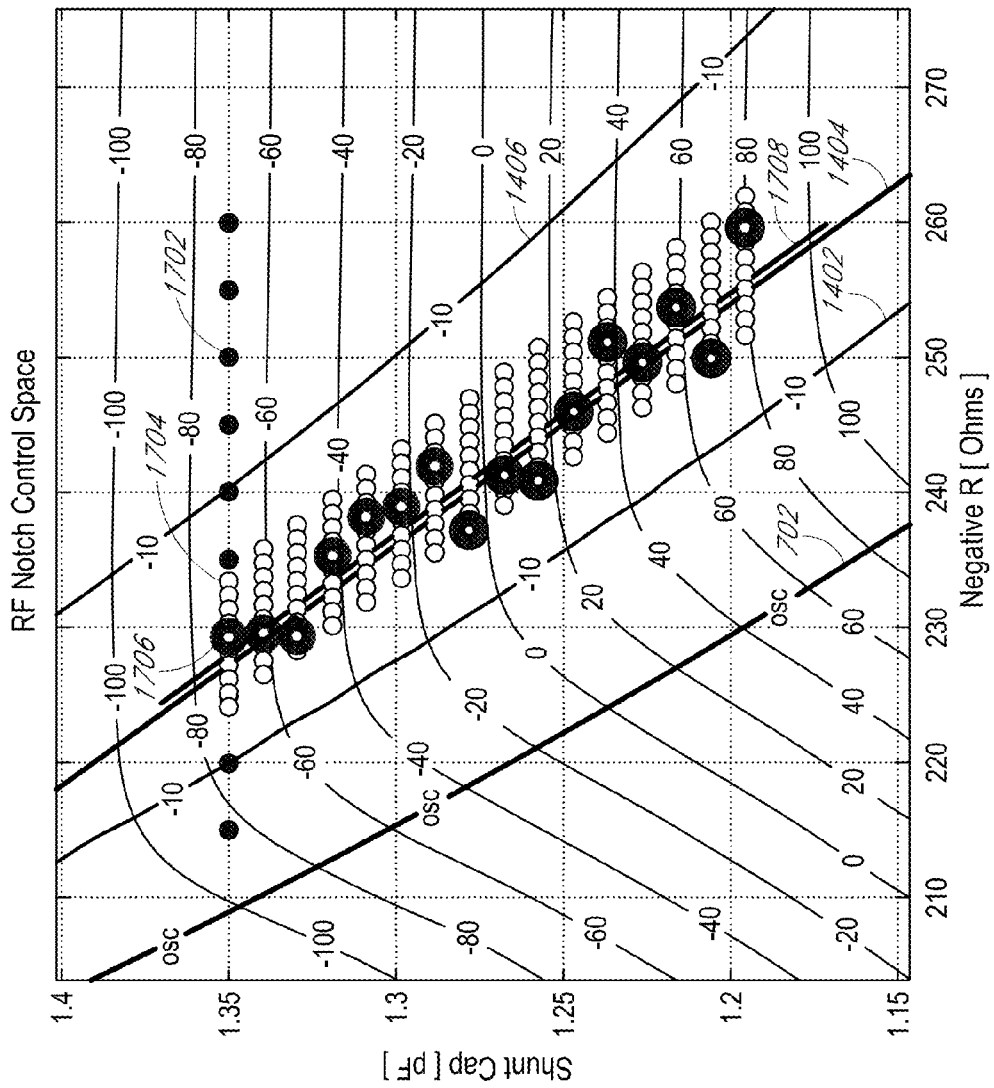
FIG. 17 is the two-dimensional chart of FIG. 15 with points drawn on the chart to illustrate an example of a technique of collecting data within the two-dimensional space to find a contour.

FIG. 17 is the two-dimensional chart of FIG. 15 with points drawn on the chart to illustrate an example of a technique of collecting data within the two-dimensional space to determine a contour. Typically, the contour that is sought is the contour 1404 for maximum attenuation described earlier in connection with FIGS. 14 and 15. For example, the variable negative resistance $R_V$ and the variable shunt capacitance $C_V$ can be controlled by the processor 1116 via the digital-to-analog converter 1118, and the effect of the notch filter circuit 1120 on the broadband noise is observed via the estimated spectrum 1604 described earlier in connection with FIG. 16. The observations of the estimated spectrum 1604 are used to determine the location of the contour 1404 (FIGS. 14, 15, and 17) for maximum attenuation.

In the illustrated embodiment, the contour 1404 is quickly and efficiently located by first using a relatively broad data spacing and then using relatively tight data spacing, as will be discussed below. The technique finds the contour 1404 quickly, which can also save battery power. However, in an alternative embodiment, a brute force technique utilizing an exhaustive search of data can be used.

In the illustrated embodiment, the estimated spectrum 1604 is observed first by holding the variable shunt capacitance $C_V$ to a constant amount of capacitance, and varying the variable negative resistance $R_V$. In a first control loop, the variable shunt capacitance $C_V$ is set to about 1.35 picofarads (pF), and the variable negative resistance is varied from 215 ohms to 260 ohms (that is, resistance is −215 ohms to −260 ohms), in relatively broad steps, such as 5 ohm steps. It will be understood that the processor 1116 does not need to be aware of a particular voltage setting for a particular amount of capacitance, such as 1.35 pF, because the notch filtering can be configured adaptively. However, if desired, the voltage settings for particular ranges of capacitance can be stored in a lookup table.

For each of the variable negative resistance $R_V$ values, an estimated spectrum, such as the estimated spectrum 1604, is observed. The observation points are illustrated by "dots" 1702 in FIG. 17, which are arranged horizontally along 1.35 pF. From these observation points, the estimated spectrum 1604 should reveal relatively deep notches at a negative resistance of 225 ohms, 230 ohms and 235 ohms. In the illustrated example, with a shunt capacitance of 1.35 pF, the coarsely taken points at 225 and 230 ohms have the two deepest notches, and an interpolation technique is used to estimate that the deepest notch may lie at a negative resistance of about 239 ohms.

A second set of data points is then taken around the point with the deepest notch. Thus, for a shunt capacitance of 1.35 pF, more data points (tighter spacing) 1704 are taken from about 224 ohms to 234 ohms to assist in locating the point along the contour 1404 with more precision. For example, 10 data points are taken from about 224 ohms to 234 ohms in 1 ohm intervals. In the illustrated embodiment, a point at 229 ohms is found to contain the deepest depth and is highlighted in FIG. 17 with a relatively larger dot 1706. This data point is stored for future reference.

The shunt capacitance $C_V$ is then adjusted, and another data point having the deepest depth is found and so on. In one embodiment, the process assumes a slope, based on, for example, simulation data, bench testing, production testing or the like, in the Negative R, $C_V$ plane for a contour having the deepest depth, and only "fine" or tight spacing data points are collected for finding the data point having the deepest depth. In an alternative embodiment, the data collection techniques with an initially coarse spacing and a subsequent narrow spacing are repeated. The resulting data points for the narrow spacings and the larger dots for the determined notch position are illustrated in FIG. 17.

The collection of points with the deepest depth, for example, the large dots 1706, are analyzed using a technique such as least squares, and the coefficients to Equations 1 and 2 are derived to model the contour 1404 for the maximum depth. The least squares fit is illustrated as a contour 1708 in FIG. 17.

In an alternative embodiment, the order of adjusting the shunt capacitance $C_V$ and the negative resistance $R_V$ is interchanged. For example, rather than holding the shunt capacitance $C_V$ constant while varying the negative resistance $R_V$, and then adjusting the shunt capacitance $C_V$ and repeating, the negative resistance $R_V$ is held constant, then the shunt capacitance $C_V$ is varied while the notch filter circuit 1120 is analyzed.

Figure 18:
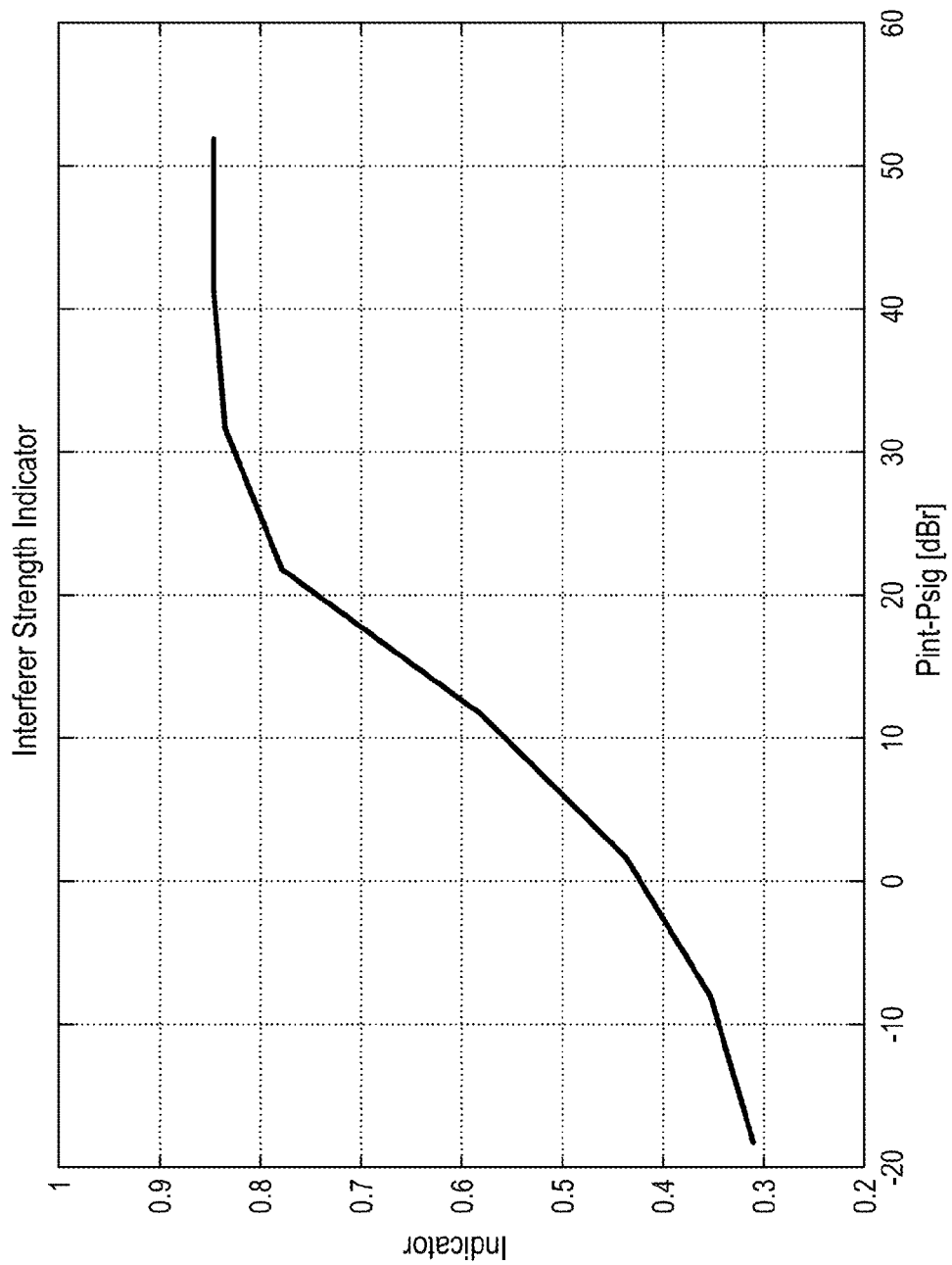
FIG. 18 is a chart that illustrates a relationship between an interferer strength and an indicator for the interferer strength.

FIG. 18 is a chart that illustrates a relationship between an interferer strength and an indicator for the interferer strength. The indicator is expressed along a vertical axis. The actual interferer strength is expressed along a horizontal axis. The general technique is discussed in U.S. patent application Ser. No. 12/055,948, filed on Mar. 26, 2008, and in FIGS. 1-8 herein. Not only can the technique described in 12/055,948 be used to estimate the strength of an interferer, but the center frequency of an interferer as well.

Figure 19:
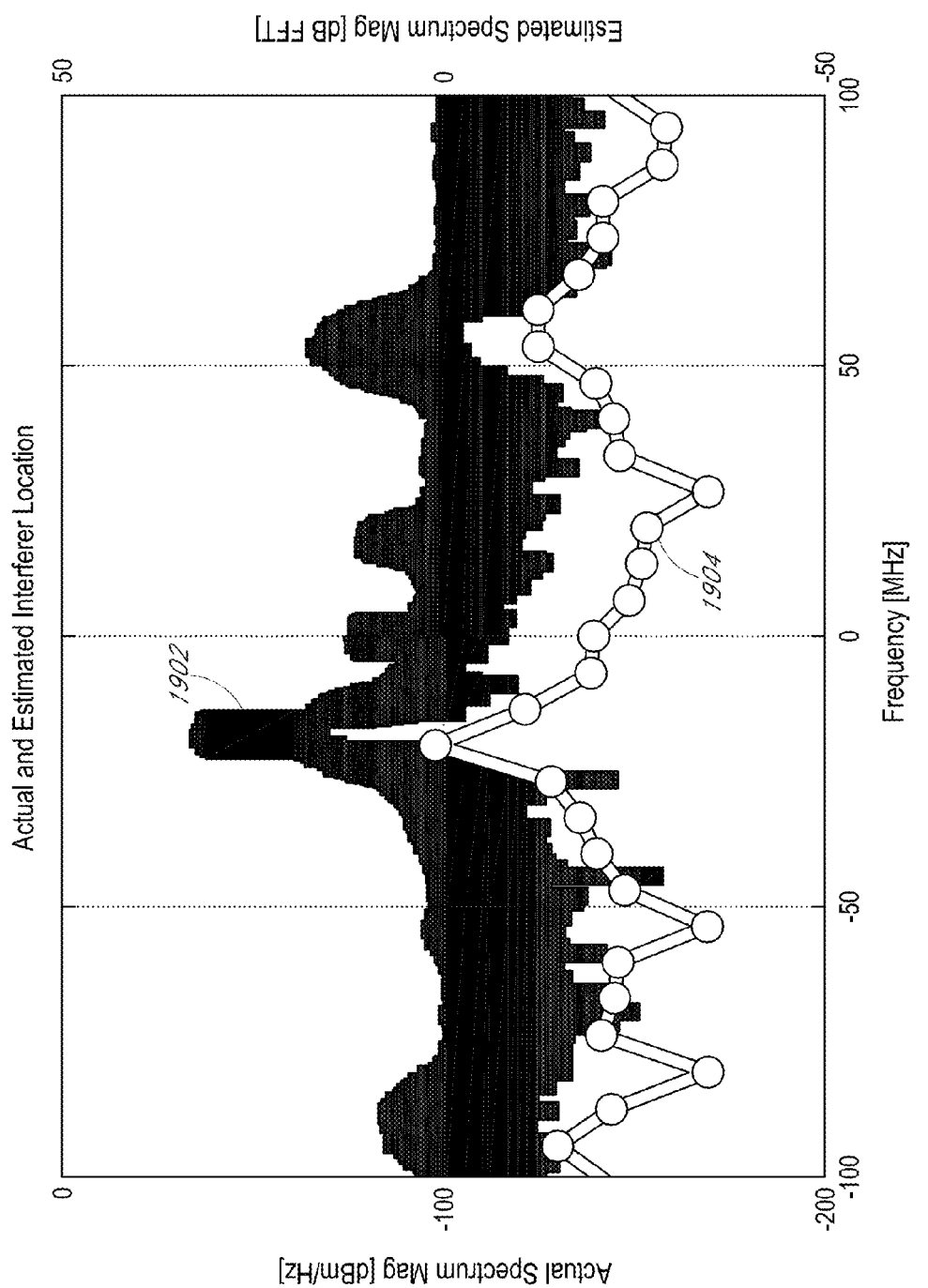
FIG. 19 is a chart that illustrates an actual interferer location and an estimated interferer location.

FIG. 19 is a chart that illustrates an actual interferer location and an estimated interferer location. Offset frequency is expressed along a horizontal axis, with 0 frequency representing the frequency of the desired signal. The spectral magnitude is represented along a vertical axis. An actual spectrum 1902 generated by a FFT is illustrated along with an estimated spectrum 1904. In FIG. 19, the estimated spectrum 1904 is estimated using the same averaging of N M-point FFTs of the sign of the down-converted signals technique described earlier in connection with FIG. 16. The technique of averaging FFTs is typically more accurate than the technique described in U.S. application Ser. No. 12/055,948 for determining the interferer center frequency. Note that the interferer is at about −20 MHz offset. The other lumps are spurious responses due to the large interferer at −20 MHz. When there is more than one interferer, the following additional techniques can be used.

Figure 20:
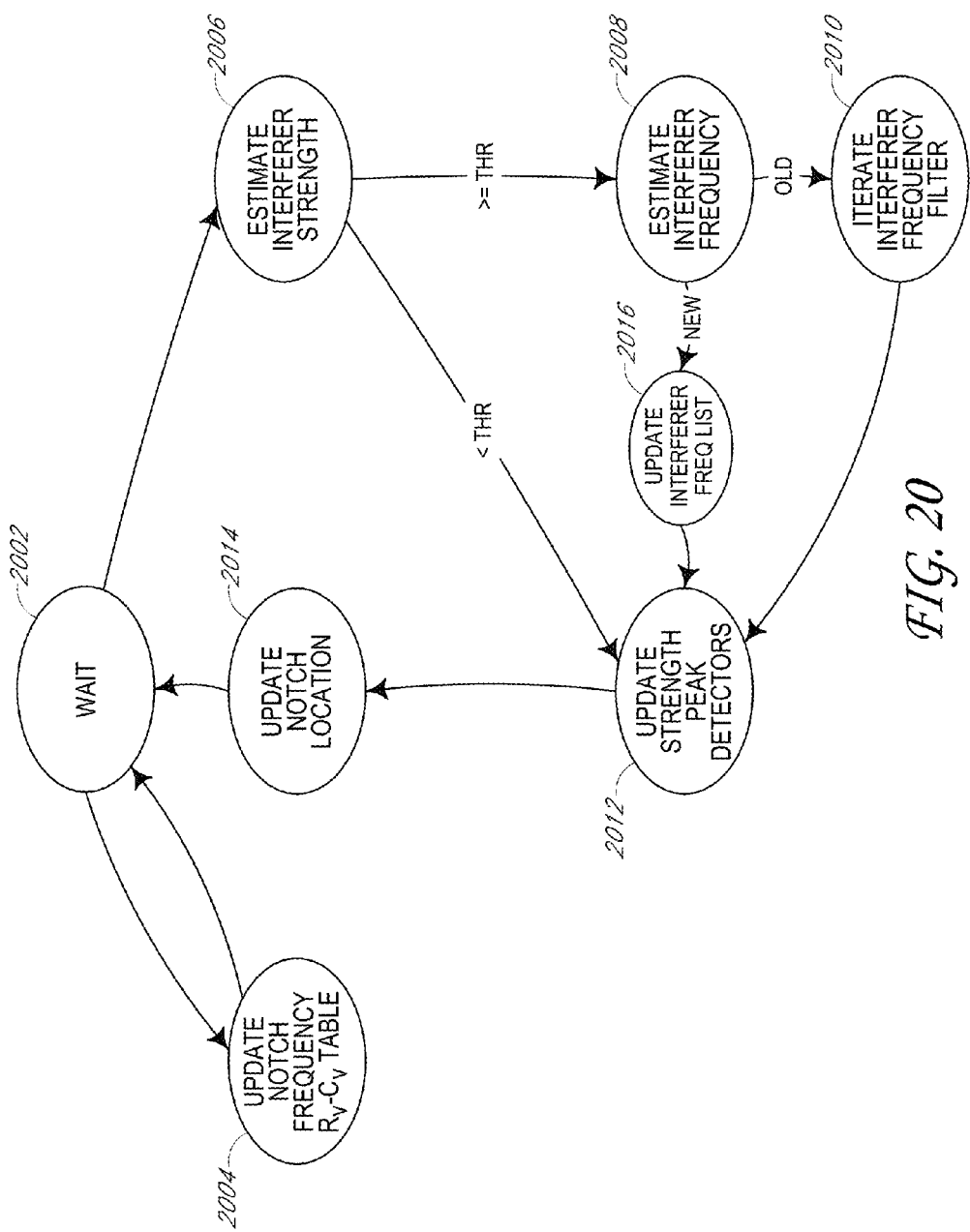
FIG. 20 is a state diagram that illustrates a technique for keeping track of multiple interferers.

FIG. 20 is a state diagram that illustrates a process for keeping track of multiple interferers. It will be appreciated by the skilled practitioner that the illustrated process can be modified in a variety of ways. For example, in another embodiment, various portions of the illustrated process can be combined, can be rearranged in an alternate sequence, can be removed, or the like. The process can be executed by the digital control 1116. Desirably, interferers are sensed and filtered out. Due to the filtering, a subsequent spectral analysis should not reveal the interferer. It would be undesirable if the digital control 1116 were to then disable filtering of the interferer because of the absence of its detection. Such simple controls could lead to an oscillating control. At the same time, it would also be undesirable if the digital control 1116 kept the frequency of the notch filter circuit 1120 at the frequency of an interferer that had gone away. The state diagram of FIG. 12 can be used to manage the filtering of one or more interferers.

The process can start at a wait state 2002, where the process generally resides unless a particular activity is selected. The three basic activities performed by the illustrated process include (1) updating the adjustable negative resistance and adjustable capacitance ($R_V$-$C_V$) table or equations (such as Equations 1 and 2); (2) updating a center frequency of the notch; and (3) estimating an interferer strength.

When in a calibration mode, which can be activated when the corresponding device is not receiving data, the tables or parameters for the equations (Equations 1 and 2) can be updated 2004. After the table or parameters are updated, the process can return to the wait state 2002.

Preferably, periodically, the process activates the state 2006 to estimate the interferer strength. For example, the techniques described in U.S. patent application Ser. No. 12/055,948 can be used. The process then determines whether the strength is greater than or equal to a threshold (THR) or is less than the threshold. The threshold should indicate a level at or above which, the interferer is deemed to be sufficiently strong that it should be filtered, whereas below this threshold, the interferer does not have to be filtered.

If the interferer strength is estimated to be above the threshold, then the process advances from the state 2006 to a state 2008, in which the interferer's frequency is estimated. The interferer's frequency is analyzed to determine whether it had previously been encountered (that is, is "old") or is a new interferer. In one embodiment, estimated frequencies near to each other are considered to be from the same interferer, that is, the same interferer may be detected at slightly different frequencies.

If the process determines that an "old" interferer is being detected, then the process advances from the state 2008 to the state 2010, where the process combines previous frequency measurement data, such as prior run-length data, with the currently measured data to help refine the frequency estimate. The process then advances from the state 2010 to a state 2012, and updates the interferer strength in a list of detected interferers. The list implements a peak detector, so that an interferer that has been filtered out by the notch filter circuit 1120 can remain filtered. The detected interferers are identified by frequency and by an estimated interferer strength, as obtained earlier in the state 2006. In one embodiment, the list is maintained in table form. This allows the process to compare the relative strengths of each interferer.

The process then advances from the state 2012 to the state 2014, which can update the decision of which interferer(s) to filter. For example, there can be more interferers than notch filter circuits, and typically, the strongest interferers are the ones that should be filtered.

Returning now to the state 2006, when the interferer is estimated to be below the threshold for filtering, the process advances to the state 2012, which was previously described.

Returning now to the state 2008, when the interferer is deemed to be "new," that is, not previously encountered, then the interferer frequency list is updated 2016, that is, an entry for the new interferer is added to the interferer frequency list. The process then advances to the state 2012, which was previously described.

The list maintained by the states 2016 and 2012 permits an interferer that has been effectively removed by the notch filtering process to remain in the list to be considered for filtering, and this prevents the process from engaging filters on and off for a single interferer in a rapid oscillation.

In one embodiment, when a receiver of a transceiver is not receiving data, the notch filtering for an interferer can be disengaged to determine whether that interferer is still present. This refreshes the peak level for the interferer's frequency. If the interferer is no longer present, it can be removed from the interferer frequency list. In an alternative embodiment, the depth of filtering for a particular interferer can be diminished over time to gracefully determine whether the interferer remains present.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
    a low noise amplifier (LNA) configured to receive a radio frequency input signal, wherein the LNA is configured to generate an amplified RF signal;
    a downconverter operatively coupled to the LNA to receive the amplified RF signal, wherein the downconverter is configured to generate a baseband signal as an output;
    a slicer operatively coupled to an output of the downconverter, wherein the slicer is configured to generate hard-decision samples of ones and zeroes as an output;
    a processor operatively coupled to the slicer, wherein the processor is configured to analyze the hard-decision samples to generate a control signal for control of filtering of at least one frequency range of the amplified RF signal; and a controllable notch filter operatively coupled to an output of the processor and to an output of the LNA, wherein the controllable notch filter is configured to receive the control signal and to filter out the at least one frequency range from the amplified RF signal.

2. The apparatus of claim 1, wherein the processor is further configured to compute Fourier Transforms of the hard-decision samples to generate an estimate of a frequency of an interferer or of the at least one filter frequency of the controllable notch filter.

3. The apparatus of claim 2, wherein the processor is further configured to compute a plurality of fast Fourier Transforms, and to generate an average of the plurality of fast Fourier Transforms to generate the estimate of the frequency of the interferer or the at least one filter frequency of the controllable notch filter.

4. The apparatus of claim 3, wherein the processor is further configured to compute 128 32-point fast Fourier Transforms, and to generate an average of the 128 32-point fast Fourier Transforms to generate the estimate of the frequency of the interferer or the at least one filter frequency of the controllable notch filter.

5. The apparatus of claim 2, further comprising a broadband noise source operatively coupled to an input of the LNA, wherein the broadband noise source is activated such that the processor can generate the estimate of the at least one filter frequency of the controllable notch filter.

6. The apparatus of claim 2, wherein the LNA is configurable to be able to switch to a high-noise state to generate broadband noise for spectral analysis of the controllable notch filter.

7. The apparatus of claim 1, wherein the processor further comprises a digital-to-analog converter configured to convert the control signal from digital form to analog form, and to provide the control signal to the controllable notch filter in analog form.

8. The apparatus of claim 1, wherein the processor is configured to identify one or more interferers from analysis of the hard decision samples, to store previously detected interferer levels in a list, and to determine the at least one frequency to filter out based at least partly on the previously detected interferer levels.

9. The apparatus of claim 1, wherein the processor is configured to identify one or more interferers from analysis of the hard decision samples, to store previously detected interferer levels in a list, to determine whether a currently detected interferer had been previously detected, and to combine current data with prior data to refine a center frequency estimate of the currently detected interferer.

10. The apparatus of claim 1, wherein the processor is configured to identify one or more interferers from analysis of the hard decision samples, is configured to temporarily disable the controllable notch filter to refresh a peak level of a previously detected interferer frequency, and wherein the processor is further configured to reevaluate whether to continue to filter out the previously identified and filtered interferer based at least partly on the refreshed peak level.

11. The apparatus of claim 1, wherein the processor is configured to identify one or more interferers from analysis of the hard decision samples, to gradually change a depth of filtering of the controllable notch filter to determine whether a previously identified and filtered interferer remains present, and wherein the processor is configured to reevaluate whether to continue to filter out the previously identified and filtered interferer based at least partly on the determination of presence.

12. The apparatus of claim 1, wherein a frequency and depth of the controllable notch filter is two-dimensionally controlled, wherein the processor is configured to generate a two-dimensional control for the control signal, wherein both a frequency and depth of filtering is two-dimensionally controlled such that both frequency and depth of filtering varies in two dimensions.

13. A method of filtering in a radio frequency front-end, the method comprising:

receiving a radio frequency input signal and amplifying the radio frequency input signal to generate an amplified RF signal;

downconverting the amplified RF signal to generate a baseband signal;

generating hard-decision samples of ones and zeroes from the baseband signal;

analyzing the hard-decision samples to detect at least one interferer and to generate a control signal for control of filtering of at least one frequency range of the amplified RF signal corresponding to the at least one interferer; and notch filtering out the at least one frequency range from the amplified RF signal based at least partly on the control signal to filter out the at least one interferer.

14. The method of claim 13, further comprising maintaining a list of the one or more interferers, and determining the at least one frequency to filter out based at least partly on the list.

15. The method of claim 13, further comprising maintaining a list of the one or more interferers, temporarily disabling notch filtering to refresh a peak level of a previously detected interferer frequency, and reevaluating whether to continue to filter out the previously detected and filtered interferer based at least partly on the refreshed peak level.

16. The method of claim 13, further comprising:
maintaining a list of the one or more interferers;
determining whether a currently detected interferer had been previously detected;
combining current data with prior data to refine a center frequency estimate of the currently detected interferer.

17. The method of claim 13, further comprising gradually changing a depth of filtering to determine whether a previously detected and filtered interferer remains present, and reevaluating whether to continue to filter out the previously detected and filtered interferer based at least partly on the determination of presence.

18. A method of filtering an interferer in a radio frequency front-end, the method comprising:

receiving a radio frequency input signal and amplifying the radio frequency input signal to generate an amplified RF signal;

downconverting the amplified RF signal to generate a baseband signal;

generating hard-decision samples of ones and zeroes from the baseband signal;

analyzing the hard-decision samples to generate a control signal for control of filtering of at least one frequency range of the amplified RF signal;

filtering out the at least one frequency range from the amplified RF signal based at least partly on the control signal; and computing Fourier Transforms of the hard-decision samples to generate an estimate of a frequency of the interferer or the at least one filter frequency of filtering.

19. The method of claim 18, further comprising computing a plurality of fast Fourier Transforms, and generating an average of the plurality of fast Fourier Transforms to generate the estimate of the frequency of the interferer or filtering.

20. The method of claim 19, further comprising computing 128 32-point fast Fourier Transforms, and generating an average from the 128 32-point fast Fourier Transforms to generate the estimate of the frequency of the interferer or filtering.

21. The method of claim 18, further comprising activating a broadband noise source for estimation of the at least one filter frequency.

22. The method of claim 18, further comprising configuring a low-noise amplifier (LNA) of the radio frequency front-end to switch to a high-noise state to generate broadband noise for estimation of the at least one filter frequency.

23. The method of claim 13, further comprising generating a two-dimensional control for the control signal, wherein both a frequency and depth of the notch filtering is two-dimensionally controlled such that both frequency and depth of filtering varies in two dimensions.

24. A method of locating a contour of optimal attenuation for a notch filter having a two-dimensional control characteristic so that both frequency and depth of filtering vary according to variation with a first control input and a second control input, the method comprising:
   (a) activating broadband noise in a front-end of a wireless receiver for calibration;
   (b) filtering the broadband noise in the front-end of the wireless receiver with the notch filter;
   (c) selecting an initial settings for the first control input of the notch filter, and then performing (d)-(f):
      (d) observing a frequency response of the notch filter for a first plurality of settings of the second control input, wherein the first plurality of settings cover a first range and are spaced apart at a first spacing;
      (e) observing the frequency response of the notch filter for a second plurality of settings of the second control input, wherein the second plurality of settings cover a second range that is smaller than the first range and covers a frequency response observation from the first range that has the deepest notch characteristic, and wherein the second plurality of settings are spaced apart by a second spacing that is tighter than the first spacing;
      (f) collecting the setting from within the second plurality of setting having the deepest notch characteristic for the particular settings of the first control input and the second control input;
   (g) repeating (d)-(f) for other settings of the first control input; and
   (h) determining a contour for control of the notch filter based on the collected setting for the first control input and the second control input having the deepest notch characteristic.

25. The method of claim 24, wherein observing the frequency response comprises estimating the frequency response by computing a fast Fourier transform of a sign of a downconverted signal associated with the broadband noise as filtered by the notch filter.

26. The method of claim 24, further comprising performing (d), (e), and (f) in sequence.

27. The method of claim 24, wherein the first control input corresponds to capacitance control and the second control input corresponds to resistance control.

28. The method of claim 24, wherein the second spacing is tighter than the first spacing by at least a factor of 4.

29. The method of claim 24, wherein determining the contour comprises using a least squares fit to the collected deepest notch characteristic settings to find coefficients that model the contour.

30. An apparatus comprising:
   (a) a controllable source of broadband noise;
   (b) a notch filter having a two-dimensional control characteristic so that both frequency and depth of filtering vary according to variation with a first control input and a second control input; and
   (c) a processor configured to control activation of the controllable source of broadband noise and control filtering by the notch filter, the processor configured to select an initial settings for the first control input of the notch filter, and then is configured to (d)-(f):
      (d) observe a frequency response of the notch filter for a first plurality of settings of the second control input, wherein the first plurality of settings cover a first range and are spaced apart at a first spacing;
      (e) observe the frequency response of the notch filter for a second plurality of settings of the second control input, wherein the second plurality of settings cover a second range that is smaller than the first range and covers a frequency response observation from the first range that has the deepest notch characteristic, and wherein the second plurality of settings are spaced apart by a second spacing that is tighter than the first spacing;
      (f) collect the setting from within the second plurality of setting having the deepest notch characteristic for the particular settings of the first control input and the second control input;
   (g) wherein the processor is configured to repeat (d)-(f) for other settings of the first control input;
   (h) wherein the processor is configured to determine a contour for control of the notch filter based on the collected setting for the first control input and the second control input having the deepest notch characteristic.

31. The apparatus of claim 30, wherein the processor is configured to observe the frequency response by estimation of the frequency response via computation of a fast Fourier transform of a sign of a downconverted signal associated with the broadband noise as filtered by the notch filter.

32. The apparatus of claim 30, wherein the processor is configured to perform (d), (e), and (f) in sequence.

33. The apparatus of claim 30, wherein the first control input corresponds to capacitance control and the second control input corresponds to resistance control.

34. The apparatus of claim 30, wherein the second spacing is tighter than the first spacing by at least a factor of 4.

35. The apparatus of claim 30, wherein the processor is configured to determine the contour via computation of a least squares fit to the collected deepest notch characteristic settings to find coefficients that model the contour.

* * * * *